(12) United States Patent
Lin

(10) Patent No.: US 11,740,549 B2
(45) Date of Patent: Aug. 29, 2023

(54) EXTREME ULTRAVIOLET LITHOGRAPHY METHOD, EXTREME ULTRAVIOLET MASK AND FORMATION METHOD THEREOF

(71) Applicant: TAIWAN SEMICONDUCTOR MANUFACTURING COMPANY, LTD., Hsinchu (TW)

(72) Inventor: Yun-Yue Lin, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 274 days.

(21) Appl. No.: 17/225,439

(22) Filed: Apr. 8, 2021

(65) Prior Publication Data

US 2022/0326597 A1     Oct. 13, 2022

(51) Int. Cl.
*G03F 1/24* (2012.01)
*G03F 7/20* (2006.01)

(52) U.S. Cl.
CPC .............. *G03F 1/24* (2013.01); *G03F 7/2004* (2013.01); *G03F 7/2008* (2013.01)

(58) Field of Classification Search
CPC ........................................................ G03F 1/24
USPC ............................................................ 430/5
See application file for complete search history.

(56) References Cited

U.S. PATENT DOCUMENTS

| 8,764,995 | B2 | 7/2014 | Chang et al. |
| 8,796,666 | B1 | 8/2014 | Huang et al. |
| 8,828,625 | B2 | 9/2014 | Lu et al. |
| 8,841,047 | B2 | 9/2014 | Yu et al. |
| 8,877,409 | B2 | 11/2014 | Hsu et al. |
| 9,093,530 | B2 | 7/2015 | Huang et al. |
| 9,184,054 | B1 | 11/2015 | Huang et al. |
| 9,256,123 | B2 | 2/2016 | Shih et al. |
| 9,529,268 | B2 | 12/2016 | Chang et al. |
| 9,548,303 | B2 | 1/2017 | Lee et al. |

*Primary Examiner* — Christopher G Young
(74) *Attorney, Agent, or Firm* — Birch, Stewart, Kolasch & Birch, LLP

(57) ABSTRACT

A method of forming an extreme ultraviolet (EUV) mask including forming a multilayer stack comprising alternating stacked Mo-containing layer and Si-containing layer over a mask substrate, forming a first nitride layer over the multilayer stack forming a capping layer over the multilayer stack, forming an absorber layer over the capping layer, and etching the absorber layer to form a pattern in the absorber layer.

20 Claims, 37 Drawing Sheets

| Compound | ΔHr (kJ) in Mo/Si MLMs | ΔHr (kJ) in Mo/RbSi MLMs |
|---|---|---|
| Mo$_3$Si | -30.5±1.5 | -5.6±1.3 |
| Mo$_5$Si$_3$ | -39.2±1.5 | -2.8±2.5 |
| MoSi$_2$ | -45.3±1.5 | +10.6±3.0 |

Fig. 19

| Mo/ | MLM parameters | | | | Reflectivity (%) |
|---|---|---|---|---|---|
| | Interlayer | $\sigma$ (nm) | $\rho$ (gr cm-3) | d (nm) | $\Gamma$ | Peak |
| Si | None | 0.71 | 2.33 | 6.92 | 0.38 | 69.5 |
| RbSi | None | 0.29 | 2.72 | 6.92 | 0.36 | 73.9 |
| RbSi | None | 0.50 | 2.72 | 6.92 | 0.36 | 71.9 |
| Si | B4C [0.30 nm] | 0.57 | 2.33 | 6.92 | 0.35 | 70.15 |

Fig. 20

EXTREME ULTRAVIOLET LITHOGRAPHY METHOD, EXTREME ULTRAVIOLET MASK AND FORMATION METHOD THEREOF

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

BRIEF DESCRIPTION OF THE DRAWINGS

Aspects of the present disclosure are best understood from the following detailed description when read with the accompanying Figures. It is noted that, in accordance with the standard practice in the industry, various features are not drawn to scale. In fact, the dimensions of the various features may be arbitrarily increased or reduced for clarity of discussion.

FIG. 19 is a chart of formation enthalpies of three $Mo_nSi_m$ compounds in Mo/Si MLMs (multilayer masks, second column) and Mo/RbSi MLMs (third column).

FIG. 20 is a chart of a few parameters of Mo/Si MLM, Mo/RbSi MLM and Mo/Si with an interlayer $B_4C$.

DETAILED DESCRIPTION

Figure 1:
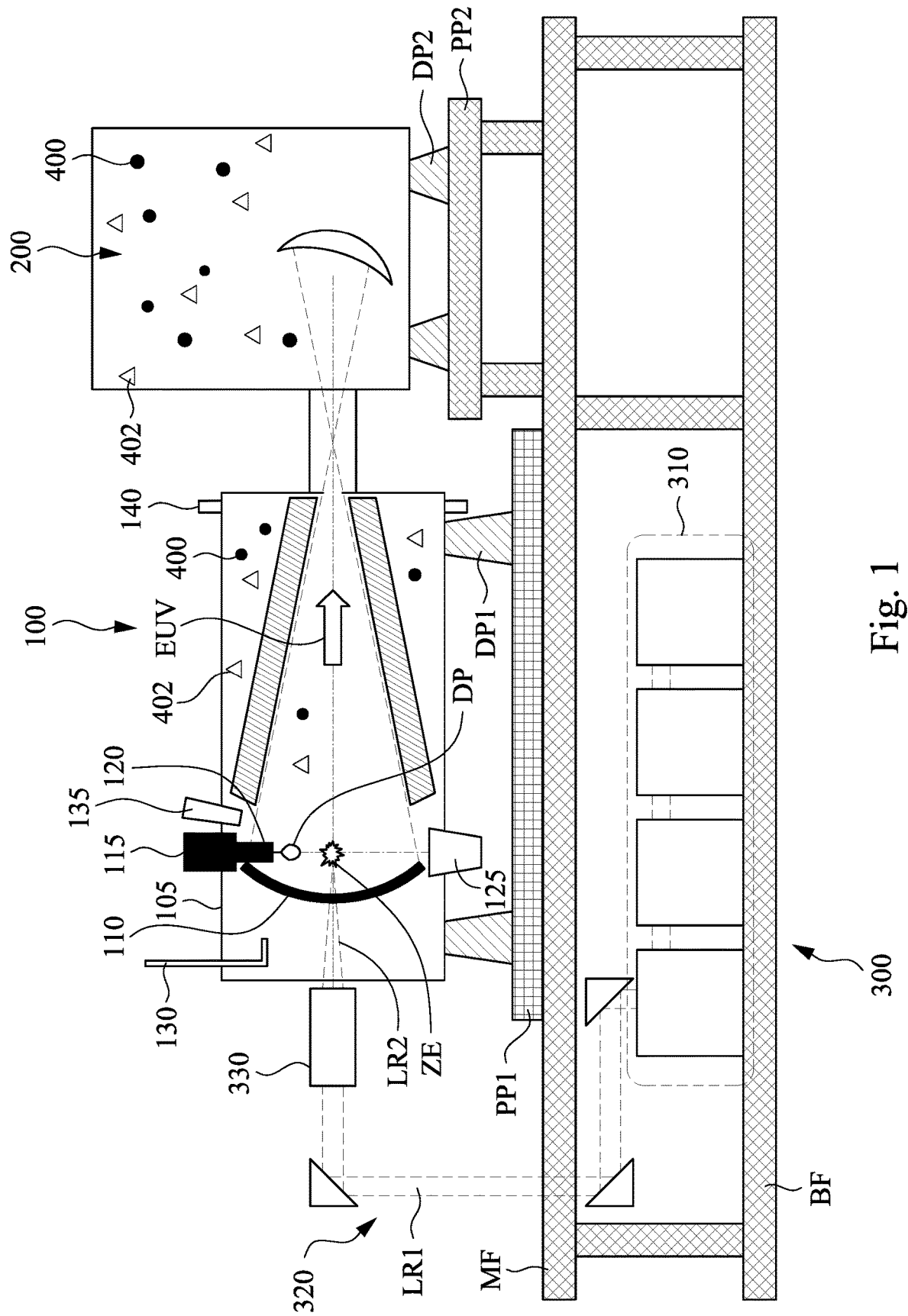
FIG. 1 is a schematic view of an EUV lithography tool with an LPP-based EUV radiation source in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in contact, and may also include embodiments in which additional features may be formed between the first and second features, such that the first and second features may not be in contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus may be otherwise oriented (rotated 90 degrees or at other orientations) and the spatially relative descriptors used herein may likewise be interpreted accordingly.

In certain embodiments, the term "about" used in this context means greater or less than the stated value or the stated range of values by a percentage such as 5%, 10%, 15%, etc. of the stated values.

To address the trend of the Moore's law for decreasing size of chip components and the demand of higher computing power chips for mobile electronic devices such as smart phones with computer functions, multi-tasking capabilities, or even with workstation power. Smaller wavelength photolithography exposure systems are desirable. Extreme ultraviolet (EUV) photolithography technique uses an EUV radiation source to emit an EUV light ray with wavelength of about 13.5 nm. Because this wavelength is also in the x-ray radiation wavelength region, the EUV radiation source is also called a soft x-ray radiation source. The EUV light rays emitted from a laser-produced plasma (LPP) are collected by a collector mirror and reflected toward a patterned mask.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

FIG. 1 is a schematic view of an EUV lithography tool with an LPP-based EUV radiation source, in accordance with some embodiments of the present disclosure. The EUV lithography system includes an EUV radiation source 100 to generate EUV radiation, an exposure device 200, such as a scanner, and an excitation laser source 300. As shown in FIG. 1, in some embodiments, the EUV radiation source 100 and the exposure device 200 are installed on a main floor MF of a clean room, while the excitation laser source 300 is installed in a base floor BF located under the main floor MF. Each of the EUV radiation source 100 and the exposure device 200 are placed over pedestal plates PP1 and PP2 via dampers DP1 and DP2, respectively. The EUV radiation source 100 and the exposure device 200 are coupled to each other by a coupling mechanism, which may include a focusing unit.

The EUV lithography tool is designed to expose a resist layer to EUV light (also interchangeably referred to herein as EUV radiation). The resist layer is a material sensitive to the EUV light. The EUV lithography system employs the EUV radiation source 100 to generate EUV light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure device 200 includes various reflective optic components, such as convex/concave/flat mirrors, a mask holding mechanism including a mask stage, and wafer holding mechanism. The EUV radiation EUV generated by the EUV radiation source 100 is guided by the reflective optical components onto a mask secured on the mask stage. In some embodiments, the mask stage includes an electrostatic chuck (e-chuck) to secure the mask.

Figure 2:
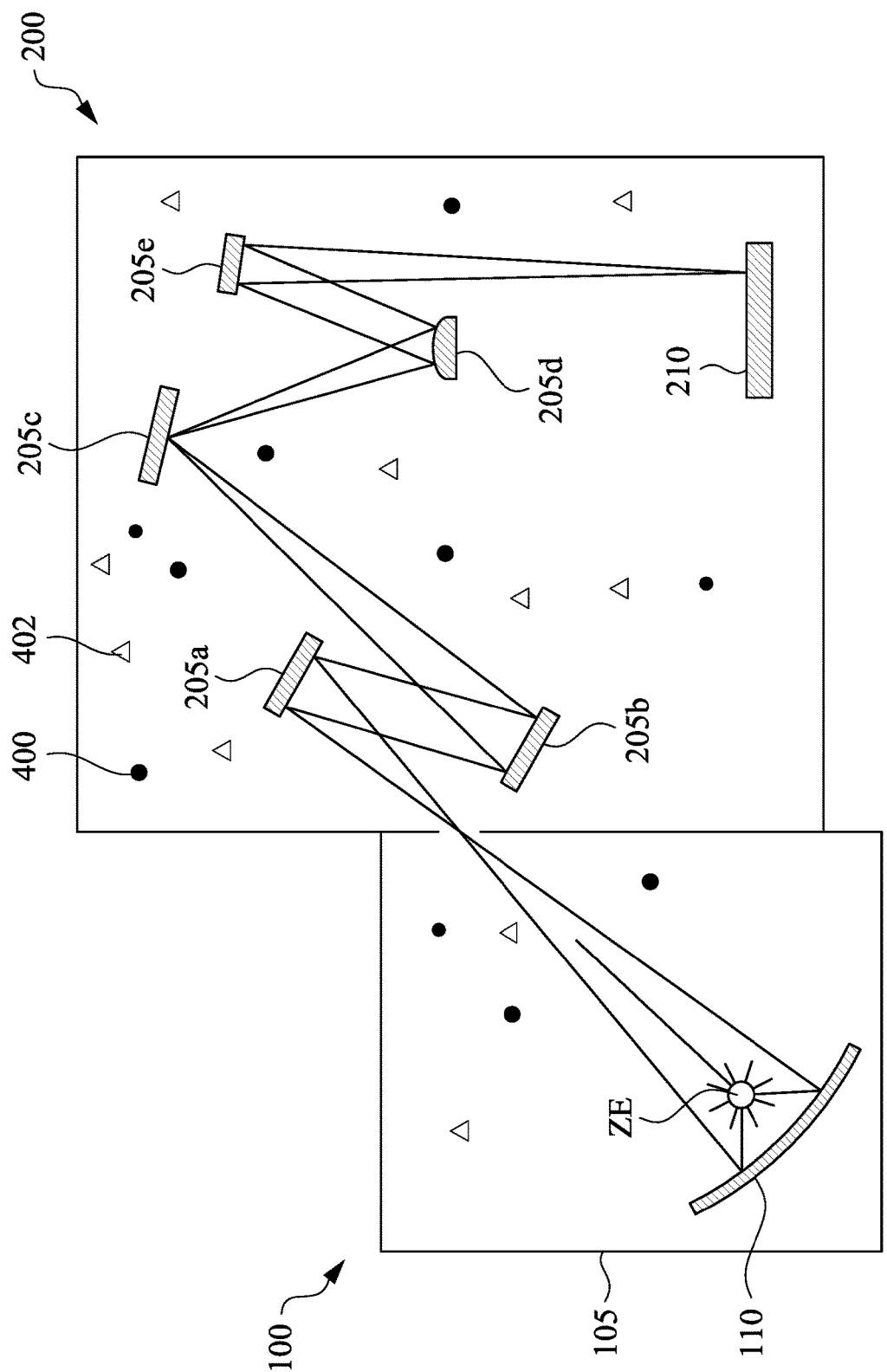
FIG. 2 is a simplified schematic diagram of a detail of an extreme ultraviolet lithography tool according to an embodiment of the disclosure showing the exposure of photoresist coated substrate with a patterned beam of EUV light.

FIG. 2 is a simplified schematic diagram of a detail of an extreme ultraviolet lithography tool according to an embodiment of the disclosure showing the exposure of photoresist coated substrate 210 with a patterned beam of EUV light. The exposure device 200 is an integrated circuit lithography tool such as a stepper, scanner, step and scan system, direct write system, device using a contact and/or proximity mask, etc., provided with one or more optics 205a, 205b, for example, to illuminate a patterning optic 205c, such as a reticle, with a beam of EUV light, to produce a patterned beam, and one or more reduction projection optics 205d, 205e, for projecting the patterned beam onto the substrate 210. A mechanical assembly (not shown) may be provided for generating a controlled relative movement between the substrate 210 and patterning optic 205c. As further shown in FIG. 2, the EUVL tool includes an EUV radiation light source 100 including an EUV light radiator ZE emitting EUV light in a chamber 105 that is reflected by a collector 110 along a path into the exposure device 200 to irradiate the substrate 210.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gradings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, the term "optic", as used herein, is directed to, but not limited to, components which operate solely or to advantage within one or more specific wavelength range(s) such as at the EUV output light wavelength, the irradiation laser wavelength, a wavelength suitable for metrology or any other specific wavelength.

Because gas molecules absorb EUV light, the lithography system for the EUV lithography patterning is maintained in a vacuum or a low pressure environment to avoid EUV intensity loss. However, in reality, in the EUV lithography system, a presence of adventitious gaseous organic compound 400 (interchangeably referred to as hydrocarbon-containing gas) is inevitably present in the exposure device 200 and the chamber 105.

In the present disclosure, the terms mask, photomask, and reticle are used interchangeably. In the present embodiment, the reflective mask 205c is a reflective mask. In an embodiment, the reflective mask 205c includes a substrate with a suitable material, such as a low thermal expansion material or fused quartz. In various examples, the material includes $TiO_2$ doped $SiO_2$, or other suitable materials with low thermal expansion. The reflective mask 205c includes multiple reflective layers (ML) deposited on the substrate. The ML includes a plurality of film pairs, such as molybdenum-containing layer-silicon containing layer film pairs (e.g., a molybdenum-containing layer above or below a silicon-containing layer in each film pair). For example, the ML may include molybdenum-silicon (Mo/Si) film pairs or MoC/RbSi film. Alternatively, the ML may include molybdenum-beryllium (Mo/Be) film pairs or other suitable materials that are configured to highly reflect the EUV light. The mask 205c may further include a barrier layer for preventing hydrogen atoms or hydrogen molecules, which will be described in details below, from penetrating into the ML. The mask 205c may further include a capping layer made of a ruthenium and at least one metal element other than ruthenium or a refractory metal boride disposed on the ML acting as an etch stop layer. The mask further includes an absorption layer (interchangeably referred to as absorber layer), such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

In various embodiments of the present disclosure, the photoresist coated substrate 210 is a semiconductor wafer, such as a silicon wafer or other type of wafer to be patterned.

The EUVL tool further includes other modules or is integrated with (or coupled with) other modules in some embodiments.

As shown in FIG. 1, the EUV radiation source 100 includes a target droplet generator 115 and a LPP collector 110, enclosed by a chamber 105. In various embodiments, the target droplet generator 115 includes a reservoir to hold a source material and a nozzle 120 through which target droplets DP of the source material are supplied into the chamber 105.

In some embodiments, the target droplets DP are droplets of tin (Sn), lithium (Li), or an alloy of Sn and Li. In some embodiments, the target droplets DP each have a diameter in a range from about 10 microns (μm) to about 100 μm. For example, in an embodiment, the target droplets DP are tin droplets, having a diameter of about 10 μm to about 100 μm. In other embodiments, the target droplets DP are tin droplets having a diameter of about 25 μm to about 50 μm. In some embodiments, the target droplets DP are supplied through the nozzle 120 at a rate in a range from about 50 droplets per second (i.e., an ejection-frequency of about 50 Hz) to about 50,000 droplets per second (i.e., an ejection-frequency of about 50 kHz) toward a zone of excitation in front of the collector 110.

Referring back to FIG. 1, an excitation laser LR2 generated by the excitation laser source 300 is a pulse laser. The laser pulses LR2 are generated by the excitation laser source 300. The excitation laser source 300 may include a laser generator 310, laser guide optics 320 and a focusing apparatus 330. In some embodiments, the laser generator 310 includes a carbon dioxide ($CO_2$) or a neodymium-doped yttrium aluminum garnet (Nd:YAG) laser source with a wavelength in the infrared region of the electromagnetic spectrum. For example, the laser generator 310 has a wavelength of about 9.4 μm or about 10.6 μm, in an embodiment. The laser light LR1 generated by the laser generator 310 is guided by the laser guide optics 320 and focused into the excitation laser LR2 by the focusing apparatus 330, and then introduced into the EUV radiation source 100.

In the present embodiment, a buffer gas is supplied from a buffer gas supply 130 through the aperture in collector 110 by which the pulse laser is delivered to the tin droplets. In some embodiments, the buffer gas includes hydrogen gas ($H_2$) 402 and other gas, such as He, Ar, $N_2$ or another inert gas. In certain embodiments, the $H_2$ gas 402 used as H radicals generated by ionization of the buffer gas can be used for cleaning purposes. The buffer gas can also be provided through one or more second buffer gas supplies 135 toward the collector 110 and/or around the edges of the collector 110. Further, the chamber 105 includes one or more gas outlets 140 so that the buffer gas is exhausted outside the chamber 105.

In some embodiments, the excitation laser LR2 includes a pre-heat laser and a main laser. In such embodiments, the pre-heat laser pulse (interchangeably referred to herein as the "pre-pulse") is used to heat (or pre-heat) a given target droplet to create a low-density target plume with multiple smaller droplets, which is subsequently heated (or reheated) by a pulse from the main laser, generating increased emission of EUV light.

In various embodiments, the pre-heat laser pulses have a spot size about 100 μm or less, and the main laser pulses have a spot size in a range of about 150 μm to about 300 μm. In some embodiments, the pre-heat laser and the main laser pulses have a pulse-duration in the range from about 10 ns to about 50 ns, and a pulse-frequency in the range from about 1 kHz to about 100 kHz. In various embodiments, the pre-heat laser and the main laser have an average power in the range from about 1 kilowatt (kW) to about 50 kW. The pulse-frequency of the excitation laser LR2 is matched with (e.g., synchronized with) the ejection-frequency of the target droplets DP in an embodiment.

The excitation laser LR2 is directed through windows (or lenses) into the zone of excitation ZE. The windows are made of a suitable material substantially transparent to the laser beams. The generation of the pulse lasers is synchronized with the ejection of the target droplets DP through the nozzle 120. As the target droplets move through the excitation zone, the pre-pulses heat the target droplets and transform them into low-density target plumes. A delay between the pre-pulse and the main pulse is controlled to allow the target plume to form and to expand to an optimal size and geometry. In various embodiments, the pre-pulse and the main pulse have the same pulse-duration and peak power. When the main pulse heats the target plume, a high-temperature plasma is generated. The plasma emits EUV radiation EUV, which is collected by the collector 110.

The collector 110 further reflects and focuses the EUV radiation for the lithography exposing processes performed through the exposure device 200. The droplet catcher 125 is used for catching excessive target droplets. For example, some target droplets may be purposely missed by the laser pulses.

In some embodiments, the collector 110 is designed with a proper coating material and shape to function as a mirror for EUV collection, reflection, and focusing. In some embodiments, the collector 110 is designed to have an ellipsoidal geometry. In some embodiments, the coating material of the collector 110 is similar to the reflective multilayer of the EUV mask. In some examples, the coating material of the collector 110 includes a ML (such as a plurality of Mo/Si film pairs or a plurality of MoC/RbSi film pairs) and may further include a capping layer (such as ruthenium and at least one metal element other than ruthenium or a refractory metal boride) coated on the ML to substantially reflect the EUV light. In some embodiments, the collector 110 may further include a grating structure designed to effectively scatter the laser beam directed onto the collector 110. For example, a silicon nitride layer is coated on the collector 110 and is patterned to have a grating pattern.

In such an EUV radiation source, photons and/or electrons generated by the laser application creates dissociation of gaseous organic compound 400 and $H_2$ gas 402. For example, during the EUV lithography, the gaseous organic compound 400 tends to react with the capping layer and form unwanted carbon contaminants on the top of the capping layer. In particular, the $H_2$ gas may be dissociated into hydrogen atoms and hydrogen radicals and penetrating into the ML. Embodiments of the present disclosure provide an improved composition for the capping layer so as to prevent the dissociated gaseous organic compound from cross-linking with the capping layer.

FIGS. 3-8B are cross-sectional views of various stages of a process for forming an extreme ultraviolet (EUV) mask M2 in accordance with some embodiments. It is understood that additional operations can be provided before, during, and after processes shown by FIGS. 3-8B and some of the operations described below can be replaced or eliminated, for additional embodiments of the method. The order of the operations/processes may be interchangeable.

Figure 3:
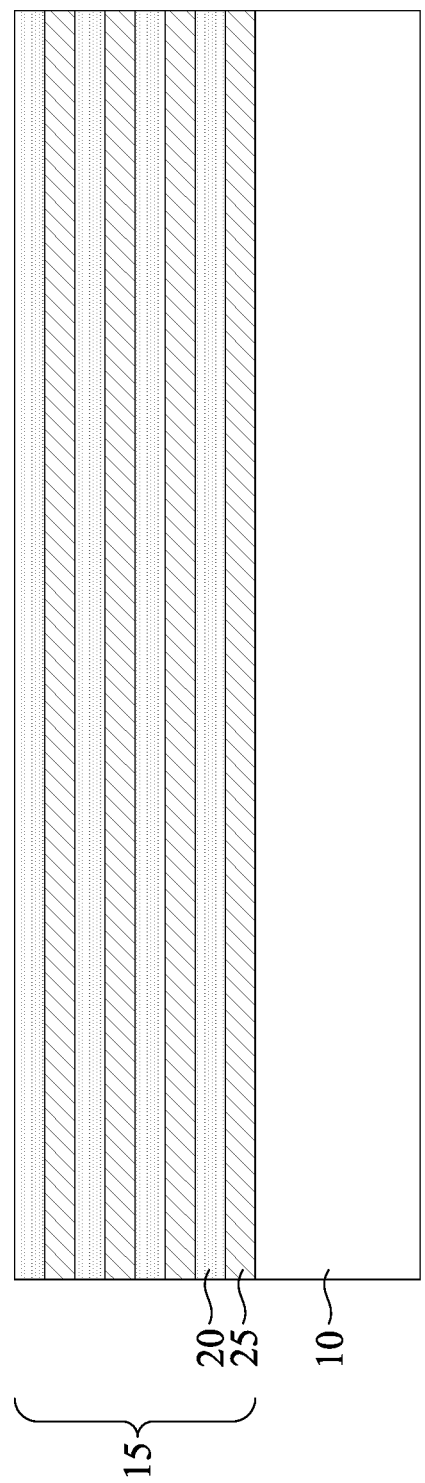
FIGS. 3, 4, 5, 6A, 6B, 7A and 7B are cross-sectional views of various stages of a process for forming an extreme ultraviolet (EUV) mask in accordance with some embodiments.

Reference is made to FIG. 3. A multilayer stack 15 of multiple alternating silicon-containing (Si-containing) layers 20 and molybdenum-containing (Mo-containing) layers 25 is formed over a substrate 10. In some embodiments, each Si-containing layer 20 has a silicon atomic percentage higher than about 90% or is a pure crystalline silicon layer. In some embodiments, each Mo-containing layer 25 has a molybdenum atomic percentage higher than about 90% or is a pure molybdenum layer. The substrate 10 is formed of a low thermal expansion material in some embodiments. In some embodiments, the substrate 10 is a low thermal expansion glass or quartz, such as fused silica or fused quartz. In some embodiments, the low thermal expansion glass substrate transmits light at visible wavelengths, a portion of the infrared wavelengths near the visible spectrum (near-infrared), and a portion of the ultraviolet wavelengths. In some embodiments, the low thermal expansion glass substrate absorbs extreme ultraviolet wavelengths and deep ultraviolet wavelengths near the extreme ultraviolet. In some embodiments, the silicon-containing layers 20 each has a thickness in a range from about 2 nm to about 4 nm, and the molybdenum-containing layers 25 each has a thickness in a range from about 3 nm to about 5 nm.

In some embodiments, the multilayer stack 15 includes from about 30 alternating layers each of silicon and molybdenum to about 65 alternating layers each of silicon and molybdenum. In some embodiments, the silicon and molybdenum layers are formed by ion beam deposition (IBD), chemical vapor deposition (CVD), plasma-enhanced CVD (PECVD), atomic layer deposition (ALD), physical vapor deposition (PVD) (sputtering), or any other suitable film forming method. In some embodiments, the silicon layers and molybdenum layers have about the same thickness. In other embodiments, the silicon layers 20 and the molybdenum layers 25 have different thicknesses.

Interdiffusion between alternating layers of the multilayer stack 15 is unwanted for serving as an EUV mask because interdiffusion may result in negative impacts on reflection of the EUV mask. In alternative embodiments, the multilayer stack 15 includes alternating layers of two alloys having low intermixing possibility therebetween. For example, the multilayer stack 15 includes from about 30 alternating layers each of rubidium silicide (RbSi) and molybdenum carbide (MoC) to about 65 alternating layers each of RbSi and MoC. FIG. 19 is a chart of formation enthalpies of three $Mo_nSi_m$ compounds in Mo/Si MLMs (multilayer masks, second column) and Mo/RbSi MLMs (third column). As shown in FIG. 19, formation of molybdenum silicide (e.g., as $Mo_3Si$, $Mo_5Si_3$, $MoSi_2$) is less unlikely to occur at the RbSi/MoC interface in RbSi/MoC MLMs than at the Mo/Si interface in Mo/Si MLMs.

Figure 21:
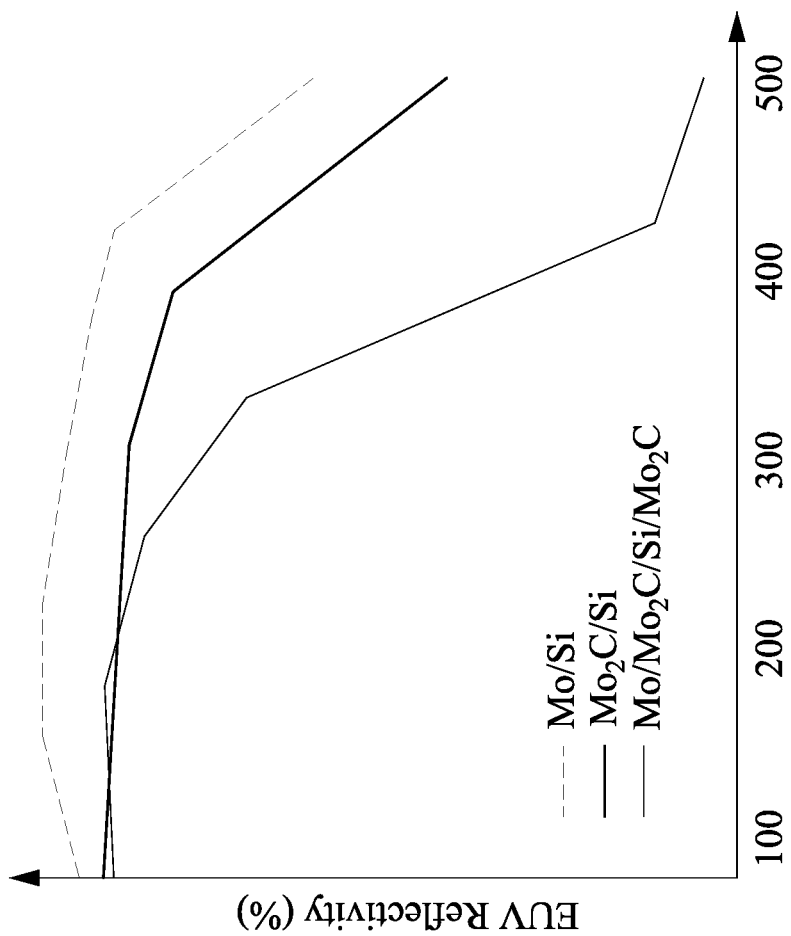
FIG. 21 is a graph of reflectivity of Mo/Si MLM, $Mo_2C/Si$ MLM, $Mo/Mo_2C/Si/Mo_2C$ MLM versus temperature.

In some embodiments where the multilayer stack 15 including alternating layers of RbSi and MoC, the multilayer stack 15 has large durable temperature tolerant and thus the reliability of the EUV mask can be effectively improved. FIG. 20 is a chart of a few parameters of Mo/Si MLM, Mo/RbSi MLM and Mo/Si MLM with an interlayer of $B_4C$. As shown in FIG. 20, Mo/RbSi MLM has a reflectivity greater than Mo/Si MLM. For example, Mo/RbSi MLM has a reflectivity of greater than about 73%, which is high enough so as to highly reflect the EUV light. FIG. 21 is a graph of reflectivity of Mo/Si MLM, $Mo_2C$/Si MLM, Mo/$Mo_2C$/Si/$Mo_2C$ MLM versus temperature. As shown in FIG. 21, the thermal durability of $Mo_2C$/Si MLM is high enough such that the reflectivity of $Mo_2C$/Si MLM remains greater than about 73% at the temperature from about 300° C. to about 600° C.

Figure 4:
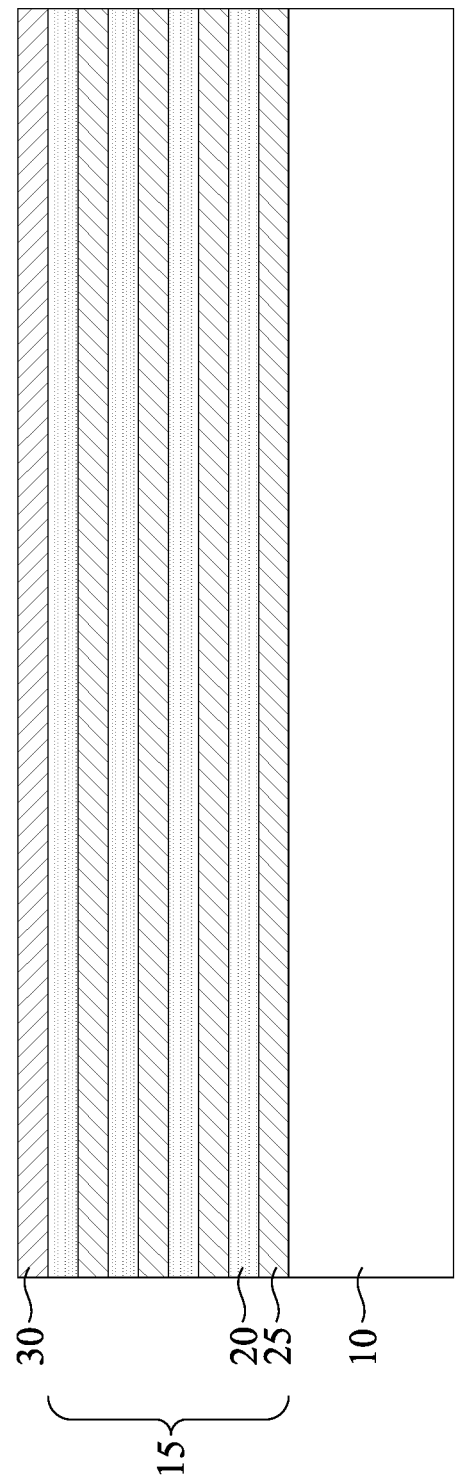

Reference is made back to FIG. 4. A barrier layer 30 is formed over the multilayer stack 15 to prevent hydrogen atoms or hydrogen radicals, which are generated during generating the EUV radiation, from penetrating into the multilayer stack 15. Such hydrogen atoms and hydrogen radicals may form undesirable hydrogen molecules ($H_2$) occupying vacancies of the topmost layer (e.g., silicon-containing layer 20) of the multilayer stack 15. In particular, the barrier layer 30 has a hydrogen diffusion coefficient less than a hydrogen diffusion coefficient of the silicon-containing layer 20 of the multilayer stack 15. In some embodiments, the barrier layer 30 has a hydrogen diffusion coefficient less than a hydrogen diffusion coefficient of the molybdenum-containing layer 25 of the multilayer stack 15. In some other embodiments where the topmost layer of the multilayer stack 15 includes silicon-containing layer 20, the silicon-containing layer 20 may have an oxidized portion, such as silicon dioxide. The hydrogen diffusion coefficient of the barrier layer 30 is less than a hydrogen diffusion coefficient of silicon dioxide as well. For example, the hydrogen diffusion coefficient of the silicon dioxide is $3.5 \times 10^{-6}$, and the hydrogen diffusion coefficient of the barrier layer 30 is in a range from about $2 \times 10^{-17}$ to about $4 \times 10^{-17}$. A hydrogen diffusion coefficient of the material is related to a lattice constant thereof. For example, the barrier layer 30 has a lattice constant less than a lattice constant of silicon and a lattice constant of silicon dioxide. In some embodiments, the barrier layer 30 is made of silicon nitride ($SiN_x$) such that the lattice constant of the barrier layer 30 is low enough to prevent hydrogen atoms and hydrogen molecules from penetrating into the underlying layers (e.g., the multilayer stack 15). In some embodiments, the barrier layer 30 has a thickness in a range from about 2 nm to about 3 nm.

Figure 5:
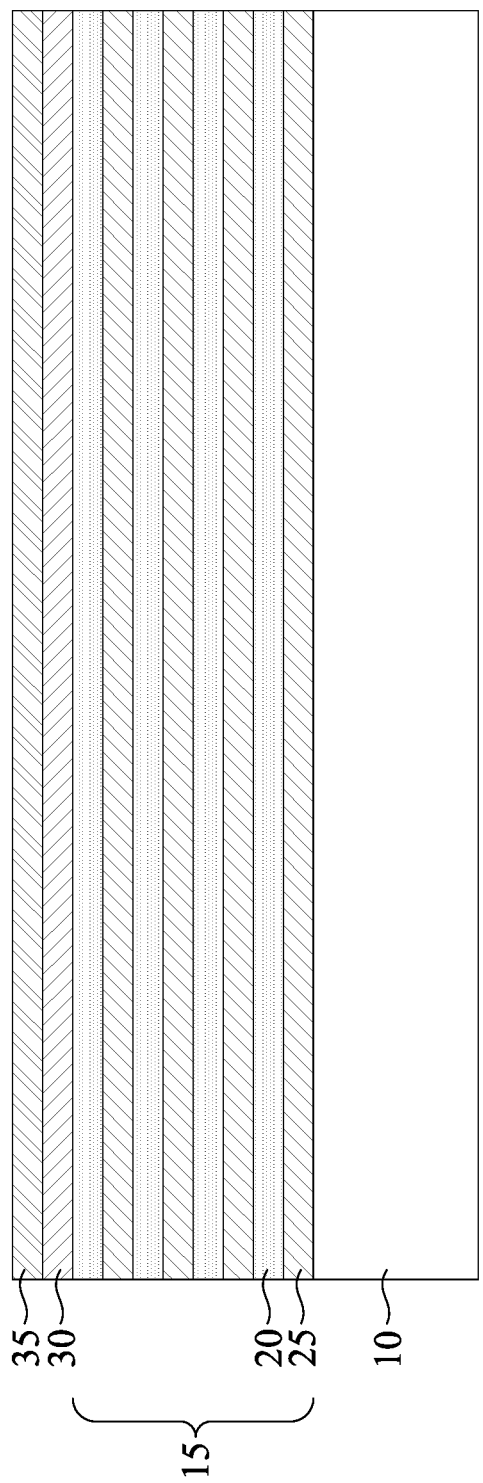

Reference is made to FIG. 5. A capping layer 35 is disposed over the multilayer stack 15. The capping layer 35 acts as an etch stop in an absorber layer patterning process. In some embodiments, the capping layer 35 is formed by chemical vapor deposition (CVD), plasma-enhanced chemical vapor deposition (PECVD), atomic layer deposition (ALD), physical vapor deposition (PVD), or any other suitable film forming method. The capping layer 35 includes ruthenium-containing (Ru-containing) alloy. In particular, the capping layer 35 is formed of Ru and a first metal. In some embodiments, the first metal may be V, Cr, Zr, Nb, Mo, Mn and Tc since V, Cr, Zr, Nb, Mo, Mn and Tc do not react with carbon. In other words, the capping layer 35 includes RuV alloy, RuCr alloy, RuZr alloy, RuNb alloy, RuMo alloy, RuMn alloy and/or RuTc alloy.

In some embodiments, the capping layer 35 includes RuRh alloy, RuPd alloy, RuIr alloy and/or RuPt alloy. That is, the first metal may be Rh, Pd, Ir and/or Pt since Rh, Pd, Ir and Pt have melting points higher than melting points of ion (Fe), cobalt (Co) and nickel (Ni). In particular, although Ru, Rh, Pd, Ir and Pt have substantially the same reactivities with carbon as the reactivities of Fe, Co and Ni with carbon, and the dissolution rates of Ru, Rh, Pd, Ir and Pt with carbon is less than the dissolution rates of Fe, Co, Ni with carbon. In this context, the dissolution rate of a material with carbon is a measure of the actual release rate of the material in carbon at a given particle size. And the reactivity of a material with carbon means the relative capacity of a material to undergo a chemical reaction with carbon.

In some embodiments, the capping layer 35 includes RuCu alloy, RuAg alloy and/or RuAu alloy. That is, the first metal may be Cu, Ag and Au since Cu, Ag and Au have less reactivities with carbon and less dissolution rates with carbon than the reactivities of Fe, Co and Ni with carbon.

In some embodiments, the capping layer 35 includes RuTi alloy, RuHf alloy, RuTa alloy and/or RuW alloy. That is, the first metal may be Ti, Hf, Ta and/or W since Ti carbide, Hf carbide, Ta carbide and W carbide are stable and Ti, Hf, Ta and W have less reactivities with carbon than the reactivities of Fe, Co and Ni with carbon.

Figure 22:
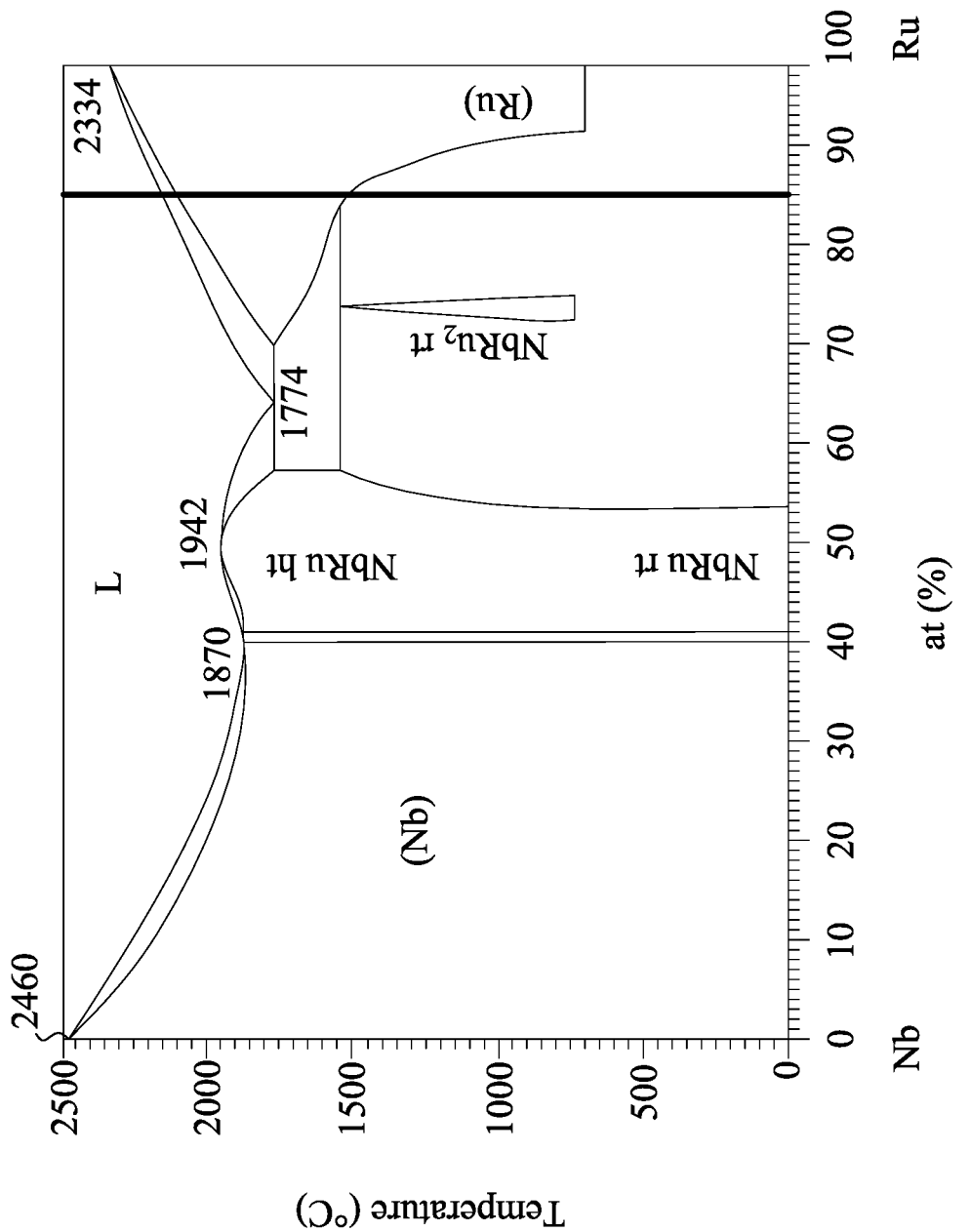
FIG. 22 is a phase diagram of Ru—Nb.
Figure 23:
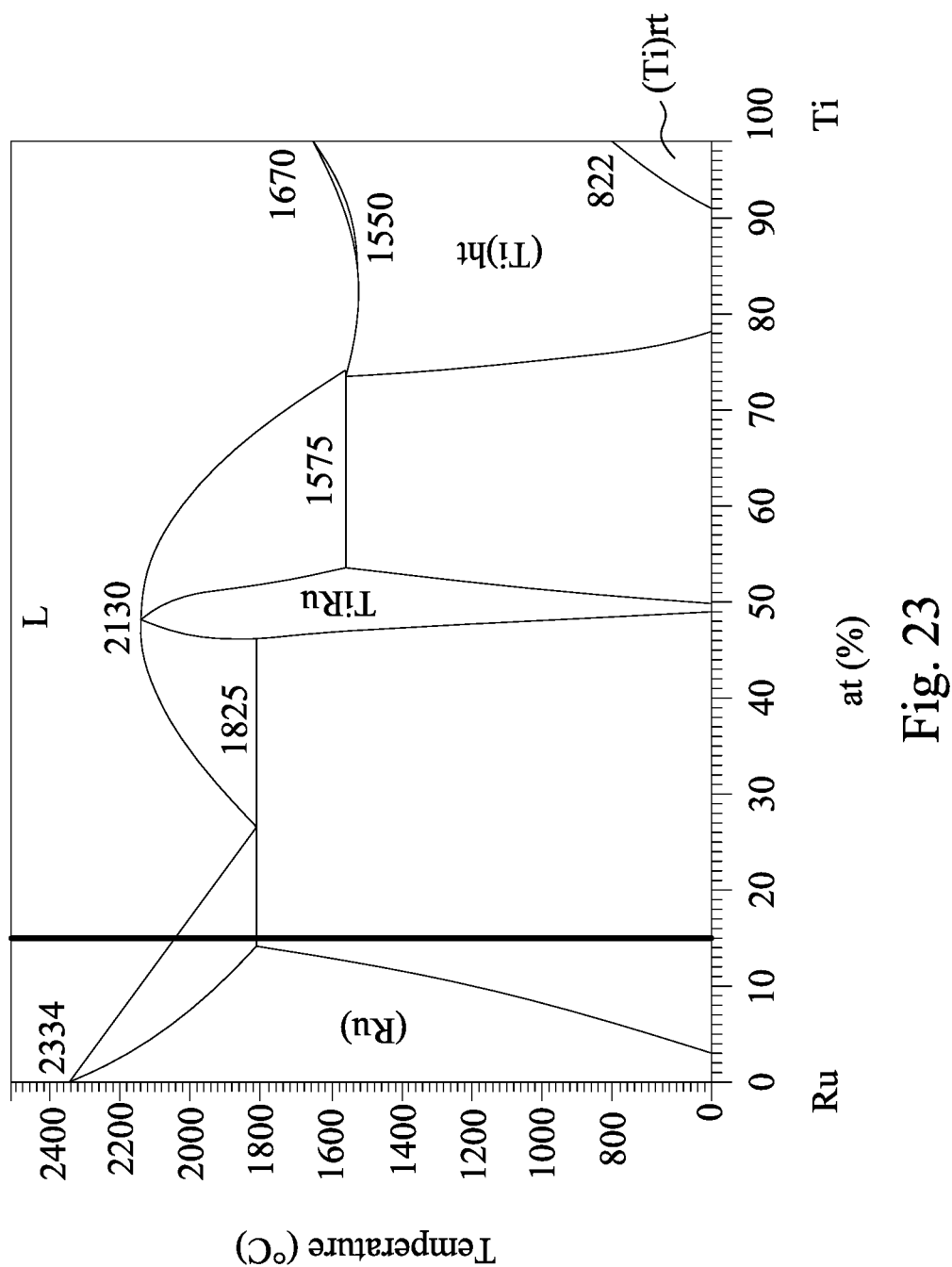
FIG. 23 is a phase diagram of Ru—Ti.
Figure 24:
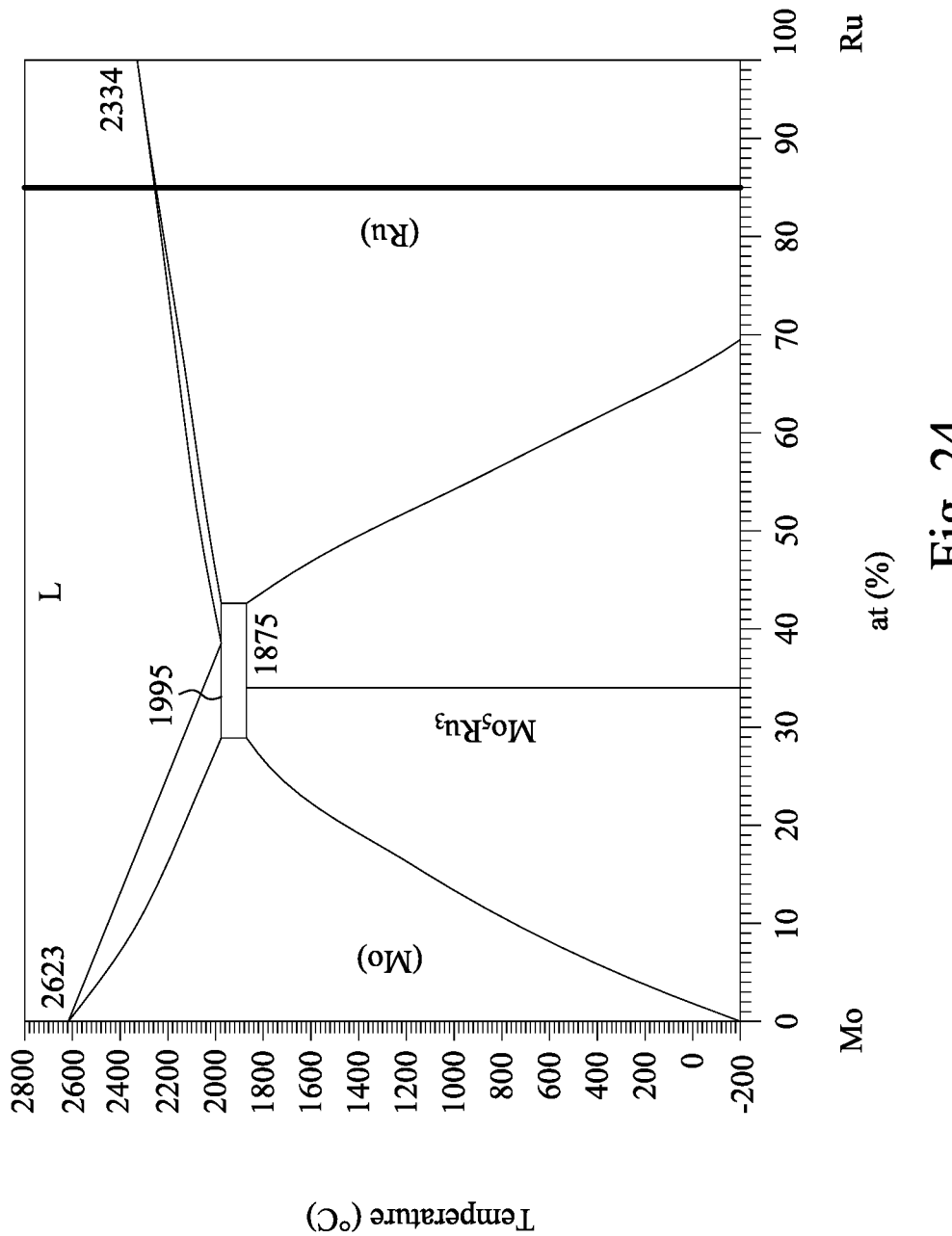
FIG. 24 is a phase diagram of Ru—Mo.
Figure 25:
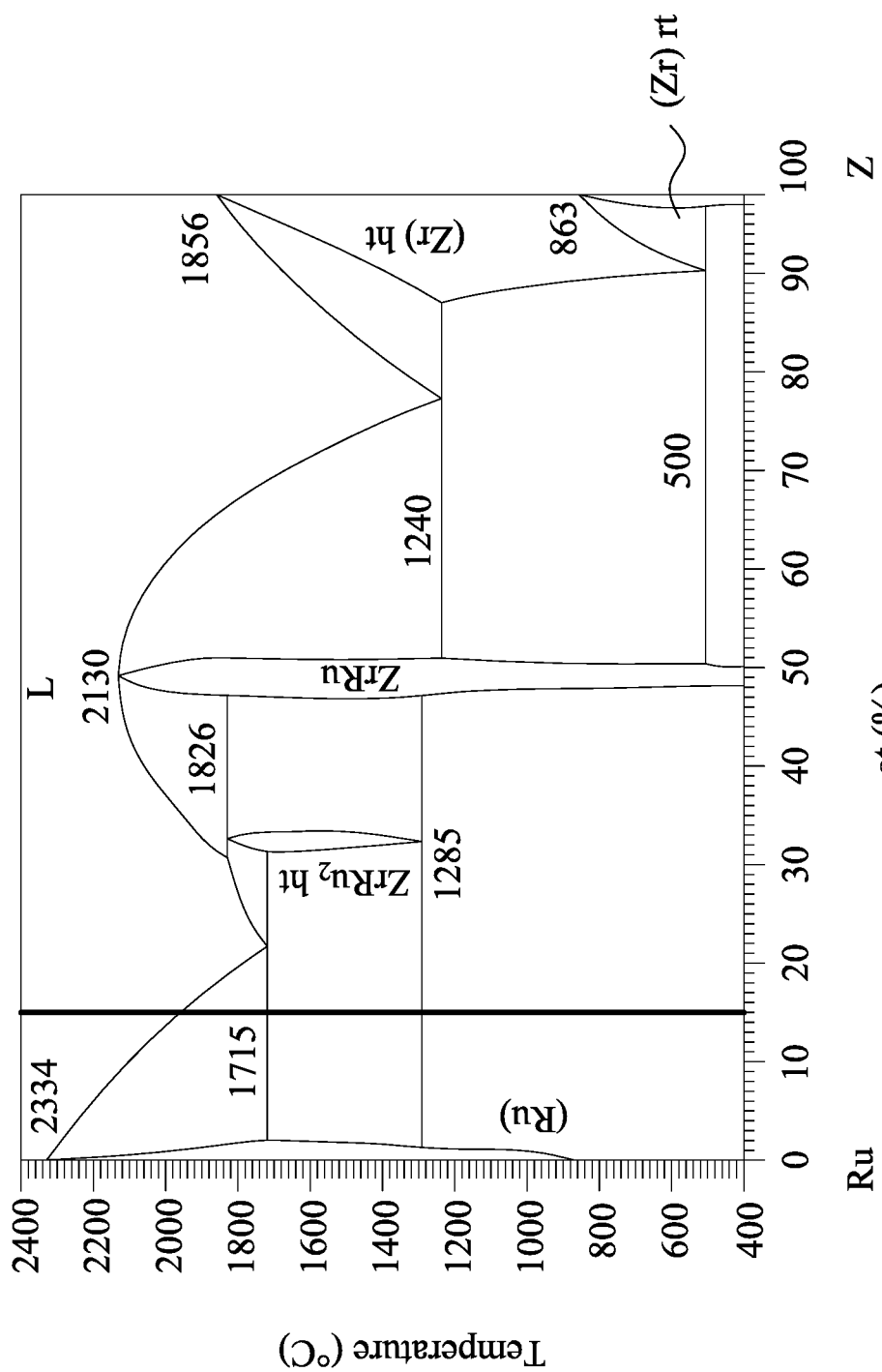
FIG. 25 is a phase diagram of Ru—Zr.
Figure 26:
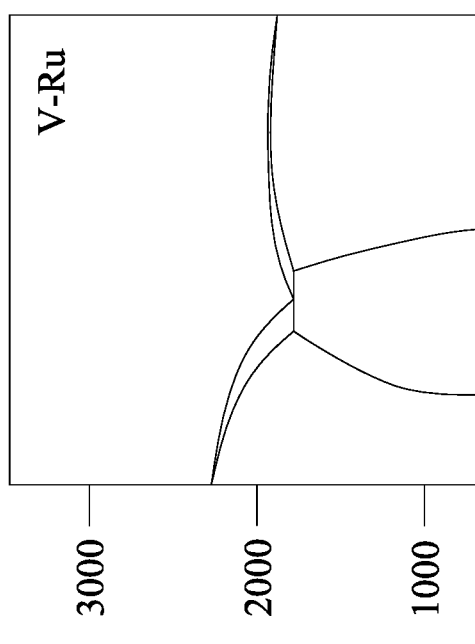
FIG. 26 is a phase diagram of Ru—V.
Figure 27:
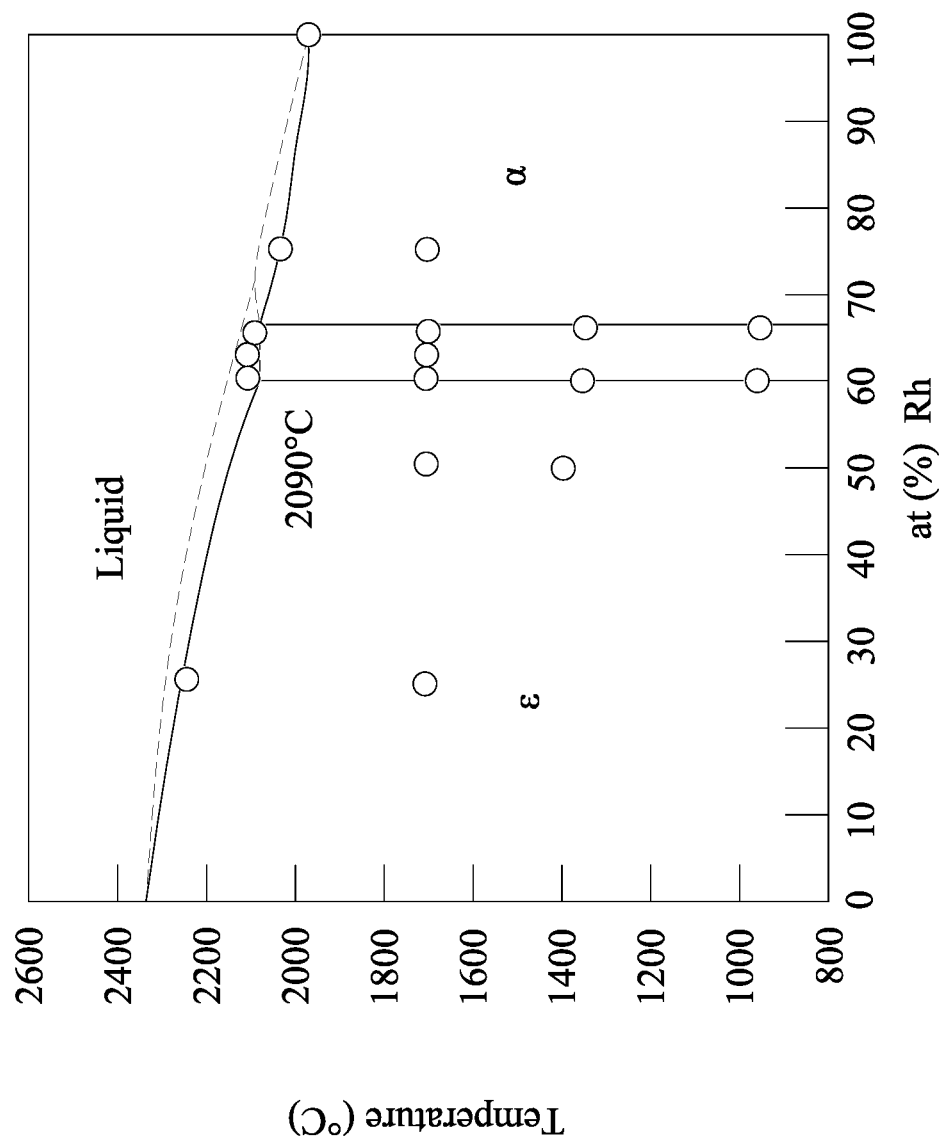
FIG. 27 is a phase diagram of Ru—Rh.
Figure 28:
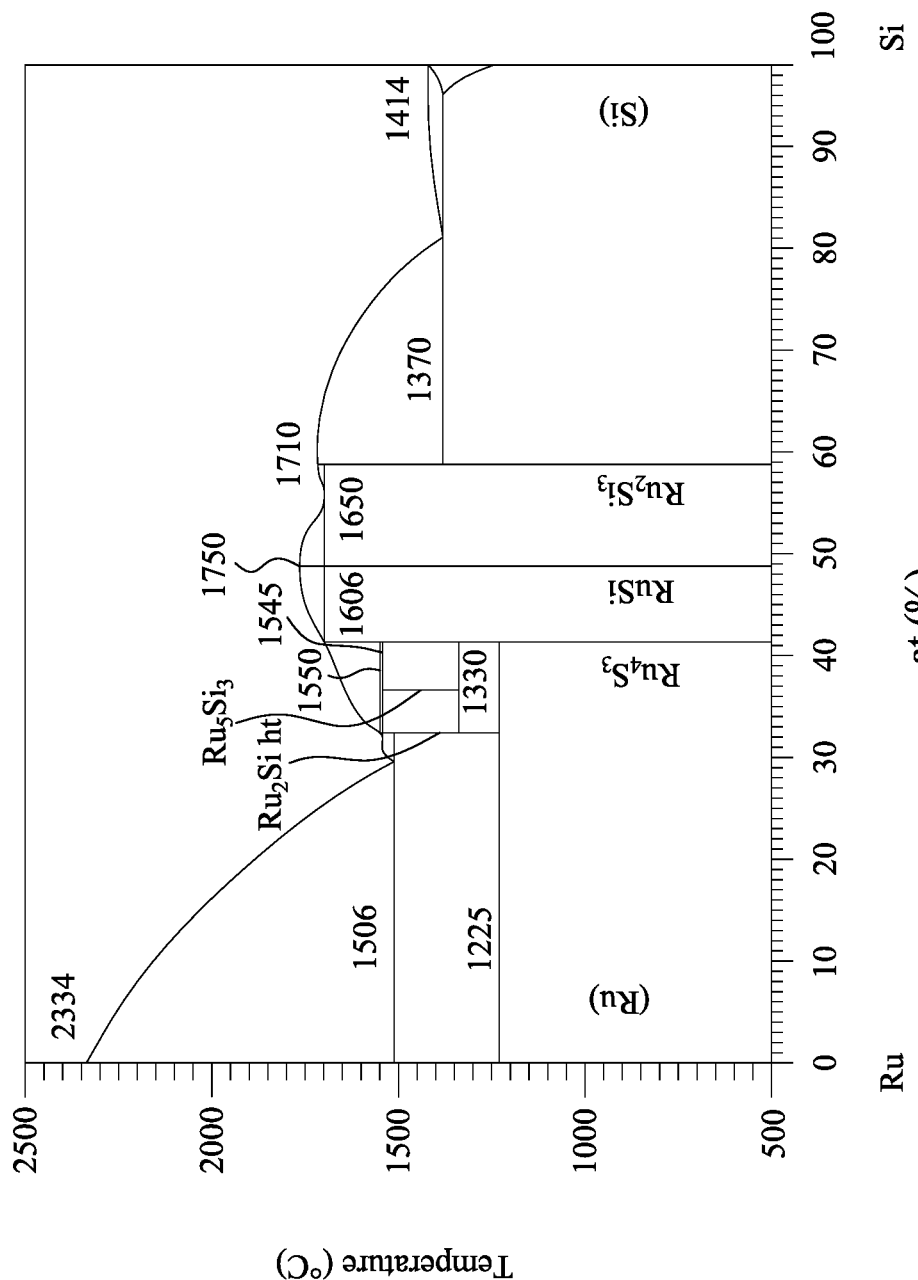
FIG. 28 is a phase diagram of Ru—Si.

FIG. 22 is a phase diagram of Ru—Nb. FIG. 23 is a phase diagram of Ru—Ti. FIG. 24 is a phase diagram of Ru—Mo. FIG. 25 is a phase diagram of Ru—Zr. FIG. 26 is a phase diagram of Ru—V. FIG. 27 is a phase diagram of Ru—Rh. FIG. 28 is a phase diagram of Ru—Si. As illustrated in the phase diagrams of FIGS. 22-28, when the capping layer 35 includes RuTi alloy, RuZr alloy, RuNb alloy, RuMo alloy, RuV alloy, and/or RuRh alloy, the capping layer 35 can be well mixed and free from brittle intermetallic compounds which may cause undesirable defects during formation thereof. As a result, the RuTi alloy, RuZr alloy, RuNb alloy, RuMo alloy, RuV alloy and RuRh alloy have large solid solution window. Therefore, the capping layer 35 has a low defect density. If the capping layer 35 includes RuSi alloy, undesirable brittle intermetallic compounds, such as silicide, may be formed and increase the defect density. In some embodiments, the capping layer 35 may be formed by in-situ (in the same reactor) ion beam deposition (IBD) with forming the multilayer stack 15 and the barrier layer 30 so that surface impurities (e.g., oxides) of the barrier layer 30 may not form. The above-mentioned Ru-containing alloys have low dissolution and/or low reactivity with carbon such that carbon contamination on the capping layer 35 caused by photon and/or electron dissociation of residual carbon containing molecules from gaseous organic compound 400 (see FIG. 1) in EUV exposure tools is prevented.

Figure 29:
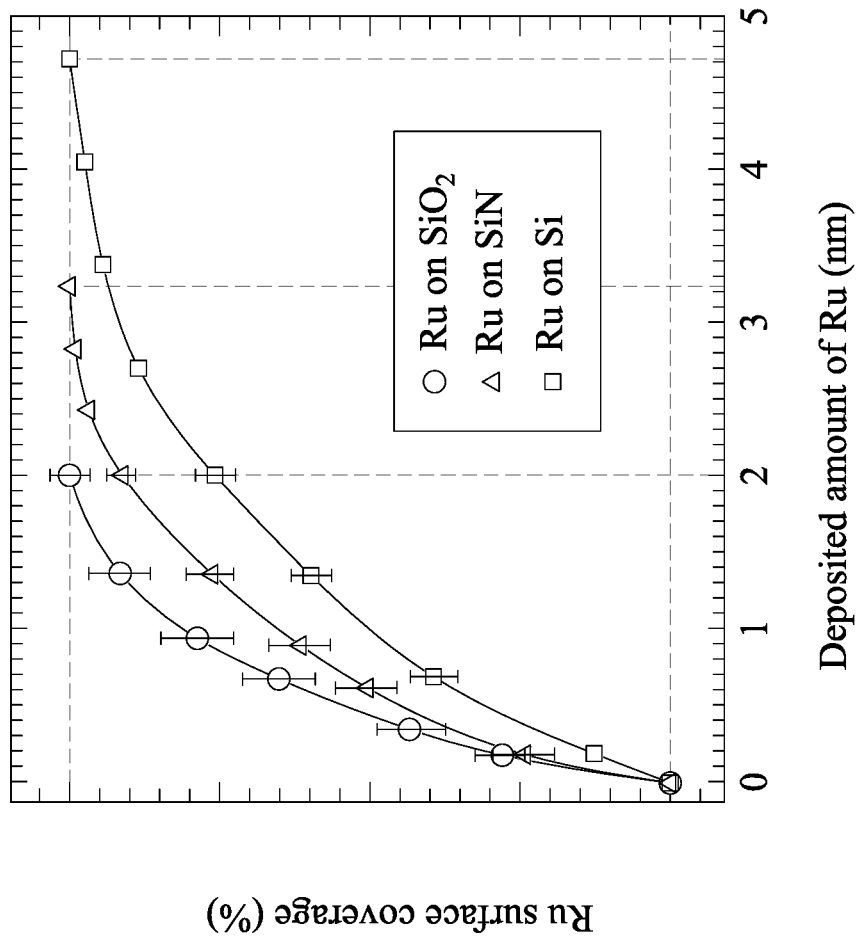
FIG. 29 shows a graph of a degree of surface coverage of Ru versus deposited amount of Ru, comparing the degree of surface coverage of Ru under conditions of underlying layer made of silicon, silicon nitride and silicon dioxide.

In particular, the material of the barrier layer 30 affects surface coverage of the overlying capping layer 35. FIG. 29 shows a graph of surface coverage of Ru versus deposited amount of Ru, comparing surface coverage of Ru among different conditions including Ru deposited on $SiO_2$, Ru deposited on SiN and Ru deposited on Si. As shown in FIG. 29, the amount of Ru to cover silicon nitride is greater than the amounts of Ru to cover silicon and silicon dioxide. In some embodiments where the barrier layer 30 includes silicon nitride, the capping layer 35 has a thickness in a range from about 1 nm to about 10 nm, for example, 3.5 nm.

Figure 6A:
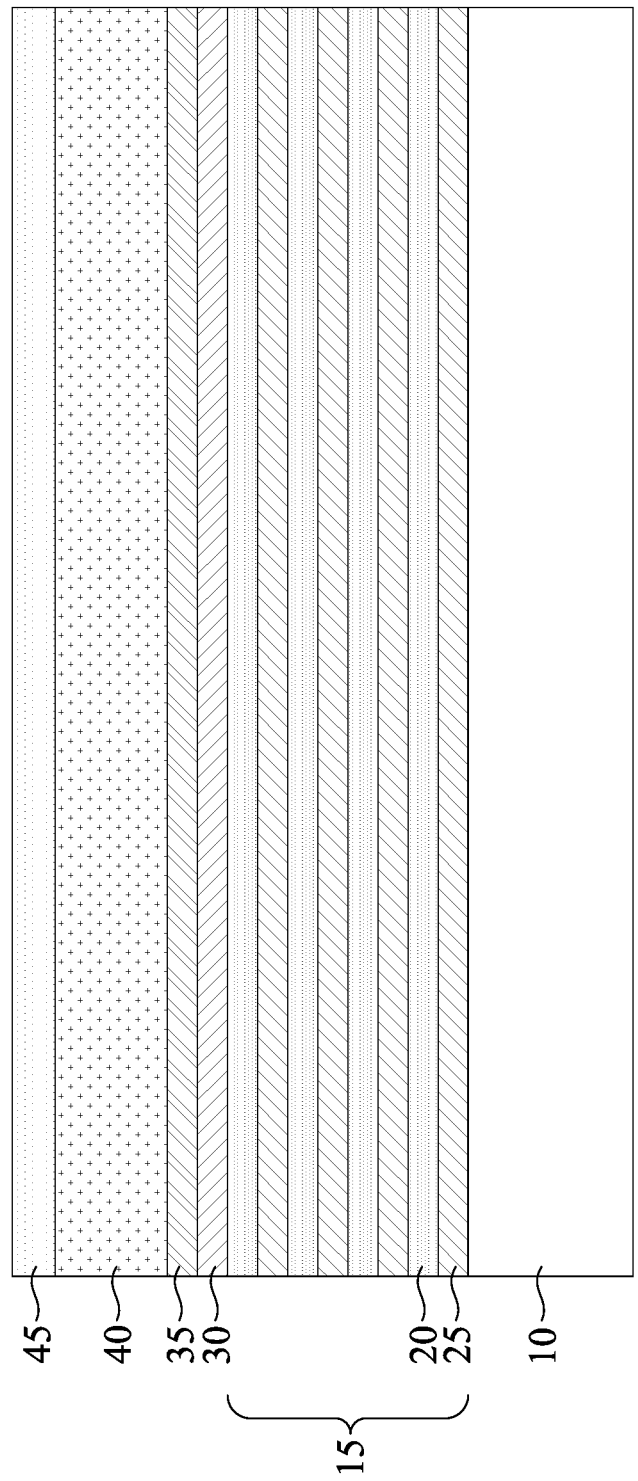
Figure 30:
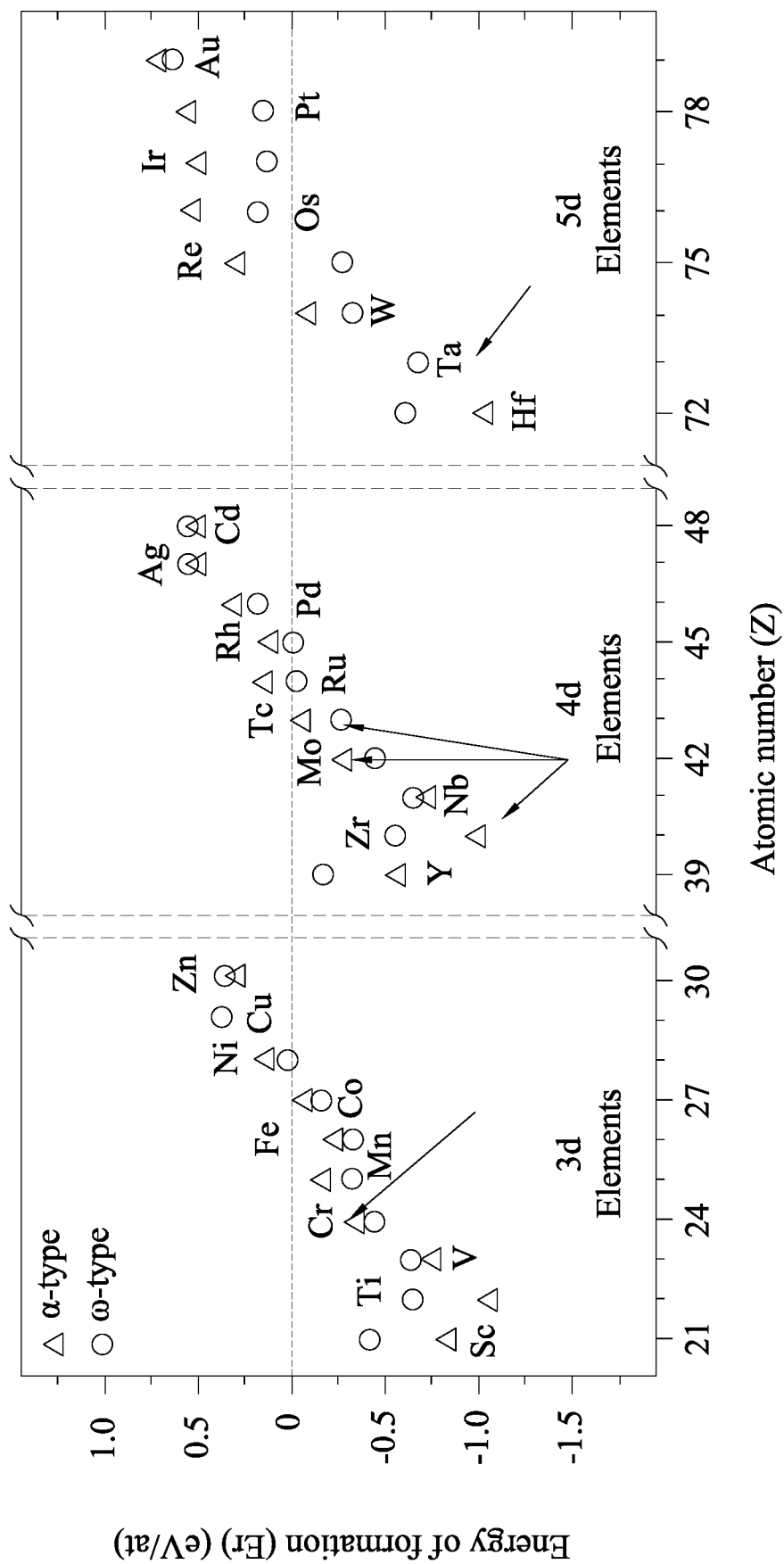
FIG. 30 is a graph of energy of formation (Er) versus atomic number (Z).

Reference is made back to FIG. 6A. An absorber layer 40 is disposed over the capping layer 35. An anti-reflection layer 45 is disposed over the absorber layer 40. Thus, an EUV photo mask blank M1 is formed. In some embodiments, the absorber layer 40 is a Ta-based material. In some embodiments, the absorber layer 40 is made of TaBSiN, TaBN, CrN, or CrB. In some embodiments, the absorber layer 25 is formed by chemical vapor deposition, plasma-enhanced chemical vapor deposition, atomic layer deposition, physical vapor deposition, or any other suitable film forming method. In some embodiments where the absorber layer 40 includes TaBN, the absorber layer 40 has a thickness in a range from about 65 nm to about 80 nm. In some embodiments where the absorber layer 40 includes CrB or CrN, the absorber layer 40 has a thickness in a range from about 40 nm to about 55 nm. The anti-reflection layer 45 is formed of a material including TaBSiO, CrON, $SiO_2$, SiN, TaBO, $TaO_5$, $Cr_2O_3$, ITO (indium tin oxide), or any suitable material, in some embodiments of the present disclosure. The anti-reflection layer 45 reduces reflections of photo-lithographic radiation. In some embodiments, the anti-reflection layer 45 has a thickness in a range from about 3 nm to about 10 nm. FIG. 30 is a graph of energy of formation (Er) versus atomic number (Z). As shown in FIG. 30, refractory metal borides are stable. In particular, CrB, Ta boride, Nb boride, Ru boride and Mo boride are stable because boron atoms increase an etching rate thereof by an interstitial structure formation. For example, TaBN has an etching rate higher than an etching rate of TaN. In some embodiments, the absorber layer 40 includes refractory metal borides, such as CrB, Ta boride, Nb boride, Ru boride and Mo boride.

Figure 6B:
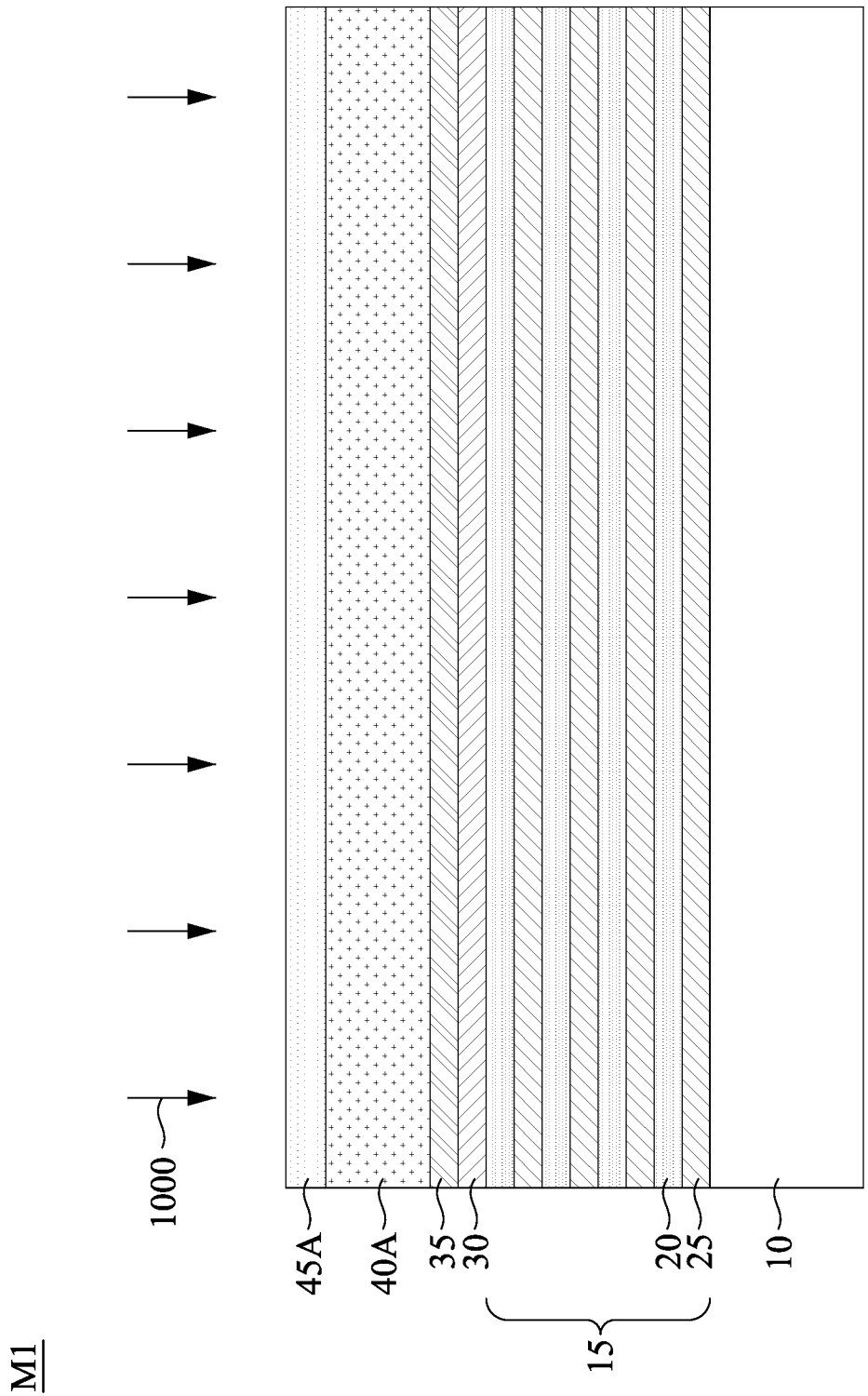

In some embodiments where the absorber layer 40 includes TaBN and the anti-reflection layer 45 includes TaBO, a doping process 1000 may be performed to the anti-reflection layer 45 and the absorber layer 40 to dope the absorber layer 40 and the anti-reflection layer 45 with dopants to form a doped absorber layer 40A and a doped anti-reflection layer 45A, as shown in FIG. 6B. In some embodiments, the dopants include silicon. Once the doping process 1000 is complete, the doped absorber layer 40A has a composition of TaBSiN and the doped anti-reflection layer 45A has a composition of TaBSiO.

Figure 7A:
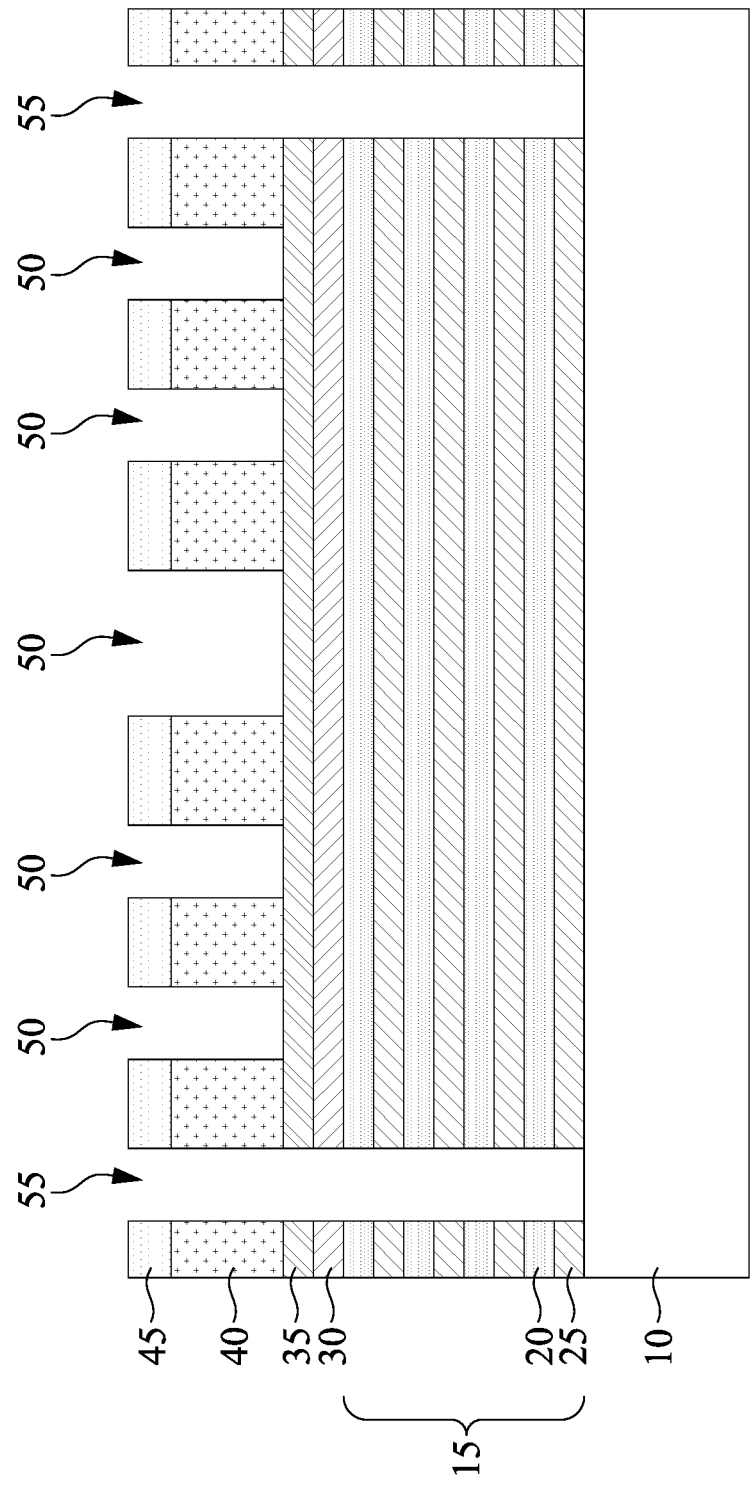
Figure 7B:
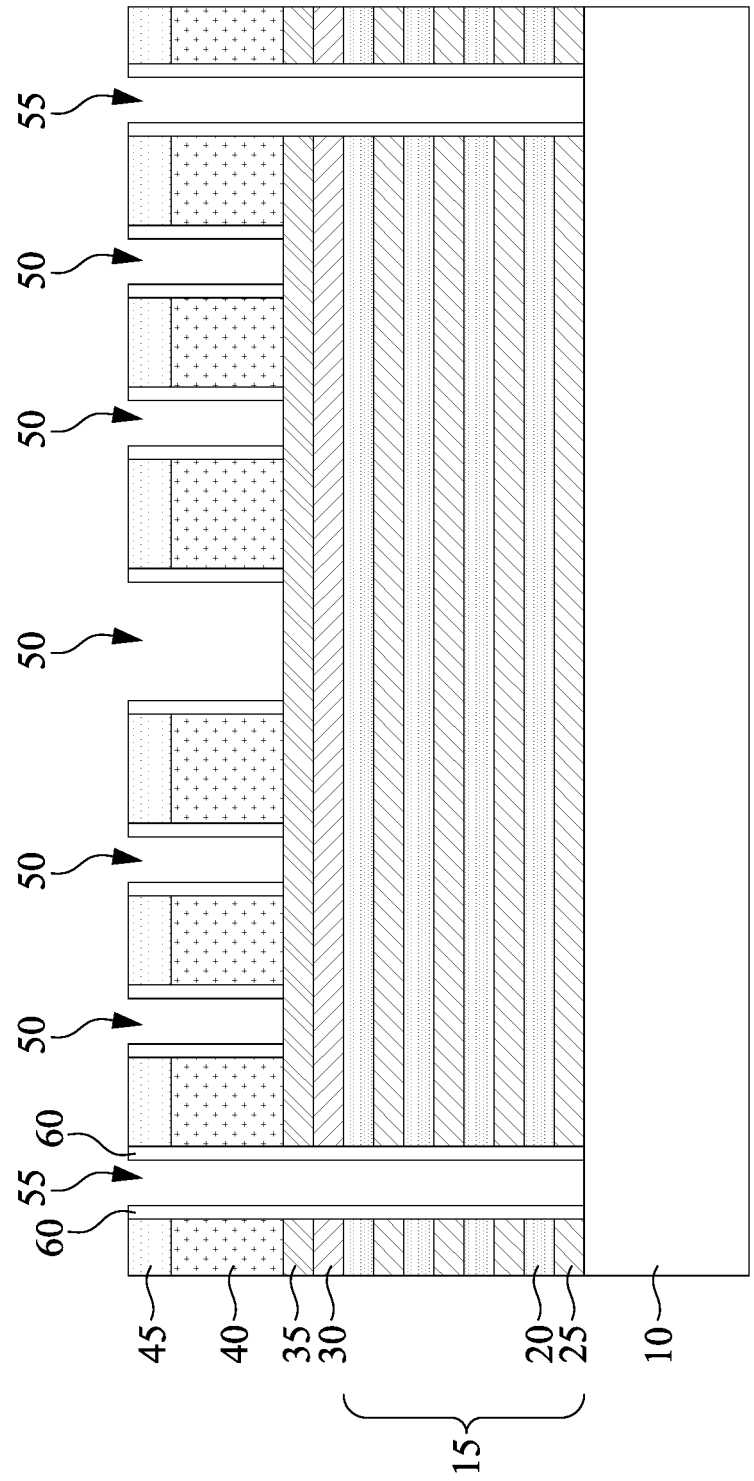

Reference is made back to FIG. 7A. One or more circuit patterns 50 are formed on the EUV photo mask blank M1 (see FIGS. 6A and 6B) by performing an etching step to pattern the absorber layer 40 and the anti-reflection layer 45.

Thus, an EUV mask M2 is formed. The EUV mask M2 is a reflective mask, and the multilayer stack 15 reflects the EUV light, while the absorber layer 40 absorbs the EUV light. During the patterning, the absorber layer 40 and the anti-reflection layer 45 are partially removed. For example, the absorber layer 40 is etched to expose the capping layer 35. In addition, a black border area 55 surrounding a circuit pattern region and penetrating to the substrate 10 is formed. The circuit patterns 50 are formed by using one or more lithography (e.g., electron beam lithography) and etching operations. In some examples, the area in which no circuit pattern is formed is covered by an absorber layer 40 so that the EUV light is not reflected.

In some embodiments, a barrier layer 60 is formed along sidewalls of the circuit patterns 50 and the black border area 55. In some embodiments, the barrier layer 60 is a TaSiN layer. The barrier layer 60 may be formed by ALD, PVD, CVD, or other suitable process followed by an etching process. In particular, the barrier layer 60 is formed by conformally forming a blanket layer over the absorber layer 40 and the anti-reflection layer 45, and an anisotropic etch (e.g., dry etching) is performed on the blanket layer to remove the horizontal portion, and the vertical portion remains after the anisotropic etch to serve as the barrier layer 60. In some embodiments, the barrier layer 60 has a nitrogen atomic percentage of from about 40% to about 60%.

Figure 8A:
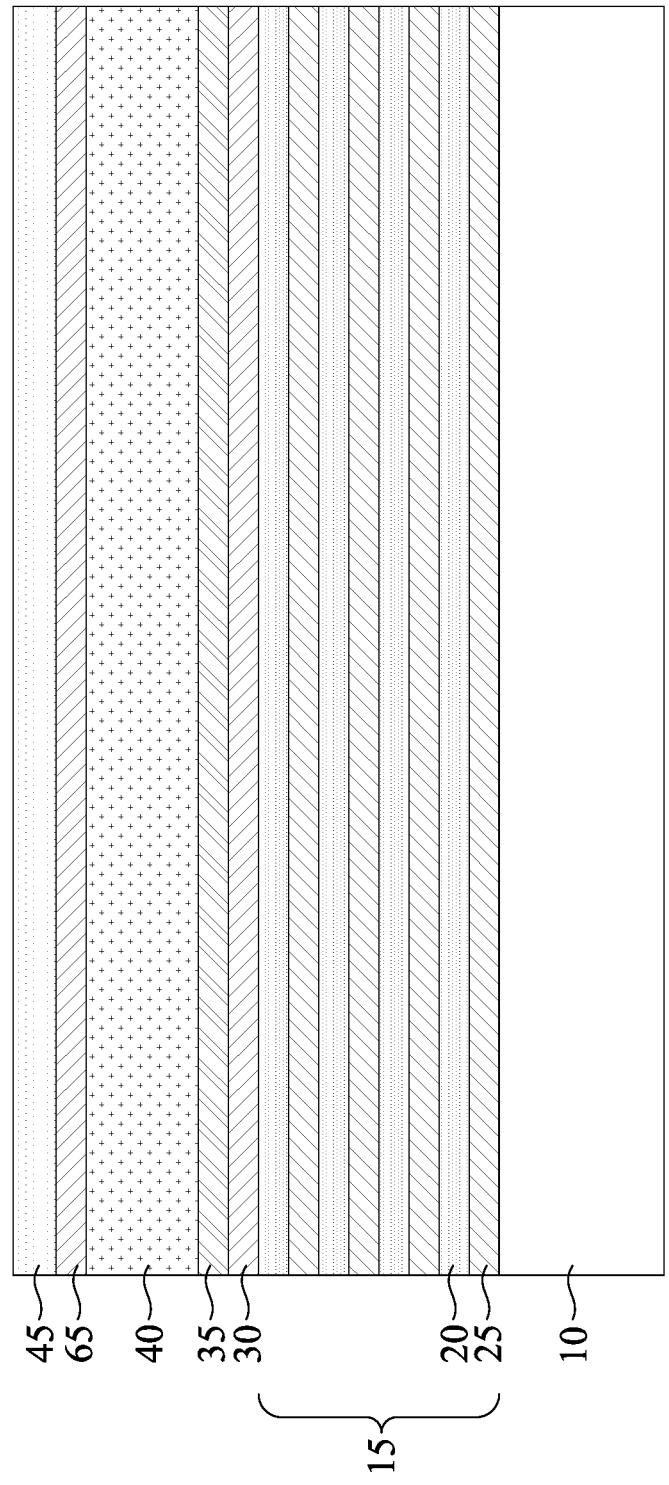
FIGS. 8A, 8B, 9A and 9B are cross-sectional views of various stages of a process for forming an extreme ultraviolet (EUV) mask in accordance with some embodiments.

FIGS. 8A, 8B, 9A and 9B are cross-sectional views of various stages of a process for forming an extreme ultra-violet (EUV) mask in accordance with some embodiments. Reference is made to FIG. 8A. FIG. 8A shows another EUV photo mask blank M1a similar to the EUV photo mask blank M1, except for an additional barrier layer 65 between the absorber layer 40 and the anti-reflection layer 45. In greater detail, the EUV photo mask blank M1a includes a substrate 10, a multilayer stack 15, a barrier layer 30, a capping layer 35, an absorber layer 40, a barrier layer 65 and an anti-reflection layer 45. As shown in FIG. 8A, the multilayer stack 15, the barrier layer 30, the capping layer 35 and the absorber layer 40 are formed over the substrate 10 in sequence using suitable methods, as discussed previously with respect to FIGS. 3-6A.

Figure 8B:
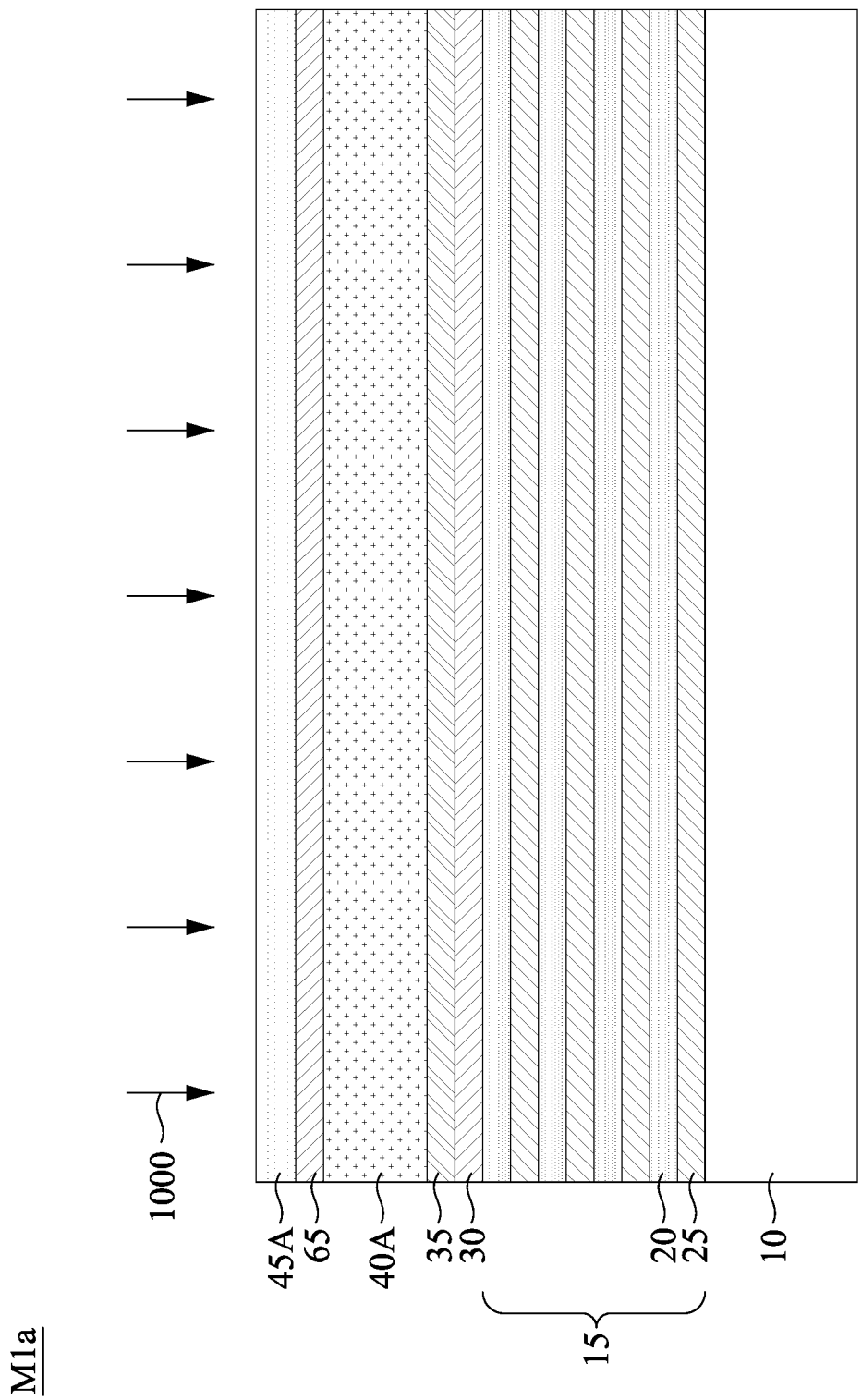

Reference is made to FIG. 8B. In some embodiments where the absorber layer 40 includes TaBN and the anti-reflection layer 45 includes TaBO, a doping process 1000 may be performed to the anti-reflection layer 45 and the absorber layer 40 to dope the absorber layer 40 and the anti-reflection layer 45 with dopants to form a doped absorber layer 40A and a doped anti-reflection layer 45A, as discussed previously with respect to FIG. 6B.

The barrier layer 65 is formed over the multilayer stack 15 to prevent hydrogen atoms or hydrogen radicals, which are generated by the EUV radiation, from penetrating into the absorber layer 40 and the capping layer 35. The barrier layer 65 has a hydrogen diffusion coefficient less than a hydrogen diffusion coefficient of the silicon layer 20 and less than a hydrogen diffusion coefficient of silicon dioxide. Also, the hydrogen diffusion coefficient of the barrier layer 65 is less than a hydrogen diffusion coefficient of the absorber layer 40. In some embodiments, the barrier layer 65 and the barrier layer 30 include the same material. For example, the barrier layer 65 is made of silicon nitride ($SiN_x$) such that the lattice constant of the barrier layer 65 is low enough to prevent hydrogen atoms and hydrogen molecules penetrating into the underlying layers. In some embodiments, the third barrier layer 65 has a thickness in a range from about 2 nm to about 3 nm.

Figure 9A:
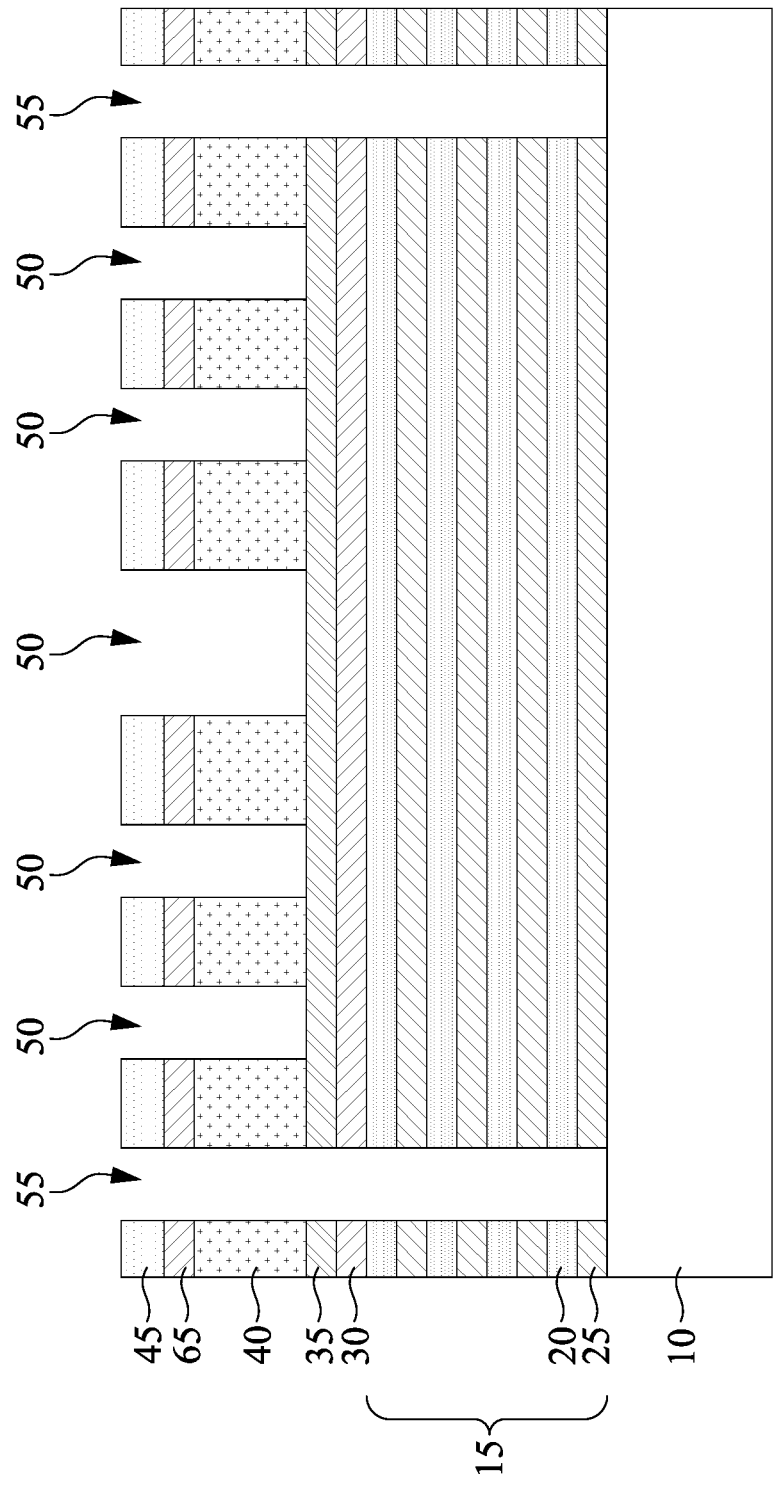

Reference is made to FIG. 9A. One or more circuit patterns 50 are formed on the EUV photo mask blank M1a by performing an etching step to pattern the absorber layer 40 and the anti-reflection layer 45. During the etching step, the absorber layer 40 and the anti-reflection layer 45 are partially removed. Therefore, a top portion of the capping layer 35 is partially exposed. In addition, a black border area 55 surrounding a circuit pattern region and penetrating to the substrate is formed. The circuit patterns 50 are formed by using one or more lithography (e.g., electron beam lithography) and etching operations. In some examples, the area in which no circuit pattern is formed is covered by an absorber layer 40 so that the EUV light is not reflected.

Figure 9B:
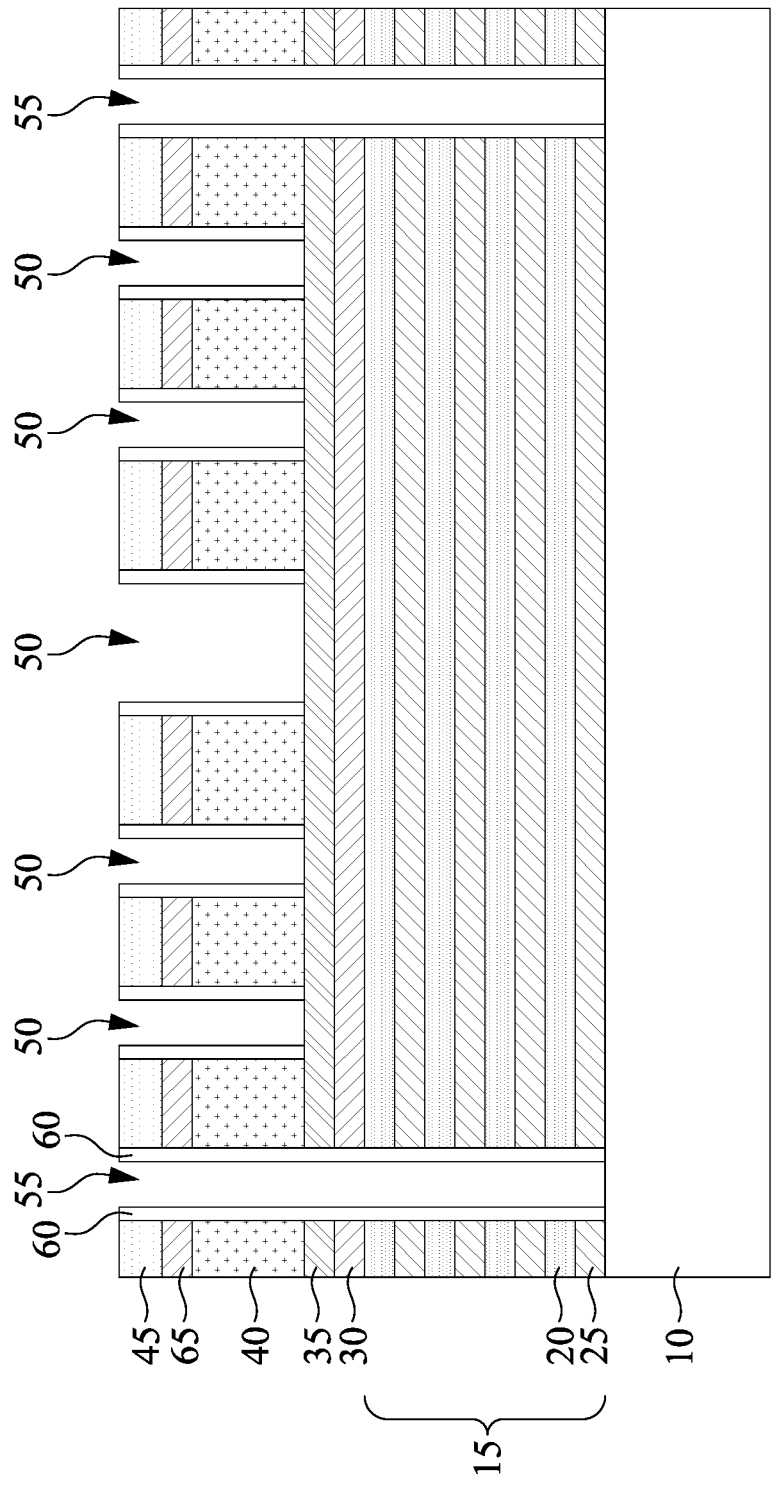

Reference is made to FIG. 9B. In some embodiments, a barrier layer 60 is formed along sidewalls of the circuit patterns 50 and the black border area 55, as discussed previously with respect to FIG. 7B. In some embodiments, the barrier layer 60 is a TaSiN layer.

Figure 10:
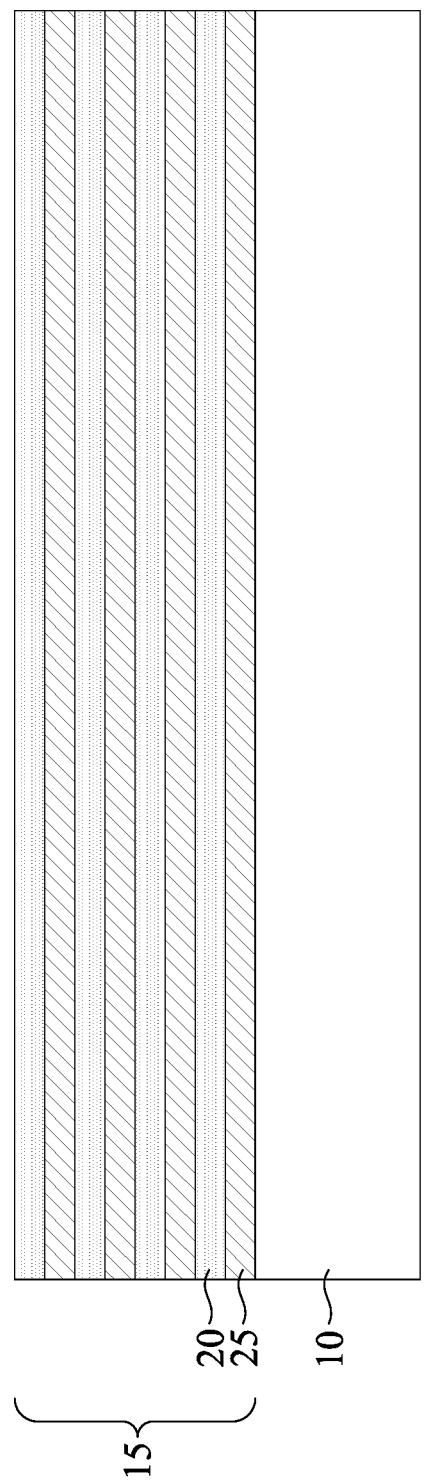
FIGS. 10, 11, 12, 13A, 13B, 14A and 14B are cross-sectional views of various stages of a process for forming an extreme ultraviolet (EUV) mask in accordance with some embodiments.

FIGS. 10-15B are cross-sectional views of various stages of a process for forming an extreme ultraviolet (EUV) mask in accordance with another embodiment. Reference is made to FIG. 10. A multilayer stack 15 of multiple alternating silicon layers 20 and molybdenum layers 25 is formed over a substrate 10, as discussed previously with respect to FIG. 3.

Figure 11:
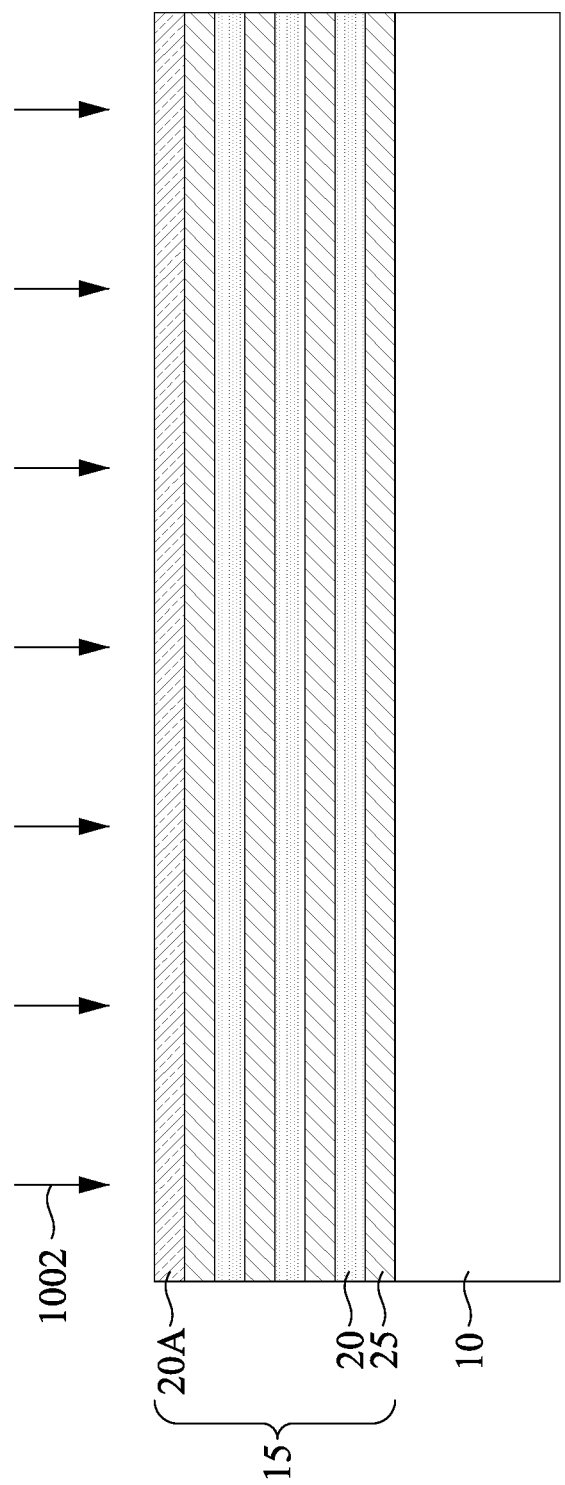

Reference is made to FIG. 11. A nitridation process 1002 is performed to the topmost silicon layer 20 (see FIG. 10) of the multilayer stack 15 to introduce nitrogens into the topmost silicon layer 20. As a result, the topmost silicon layer 20 is nitrided to become a nitride layer 20A to serve as a barrier layer 30 which is configured to prevent hydrogen atoms or hydrogen radicals, which are generated by the EUV radiation, from penetrating into the multilayer stack 15 to form undesirable hydrogen molecules ($H_2$) occupying vacancies of the molybdenum-containing layer 25 of the multilayer stack 15 under the nitride layer 20A. In some embodiments, the nitride layer 20A includes silicon nitride ($SiN_x$). In some embodiments, the nitridation process 1002 is carried out at pressures of about 1 mTorr to about 20 mTorr and temperatures of about 25° C. to about 50° C. for a period of about 10 seconds to about 600 seconds.

Figure 12:
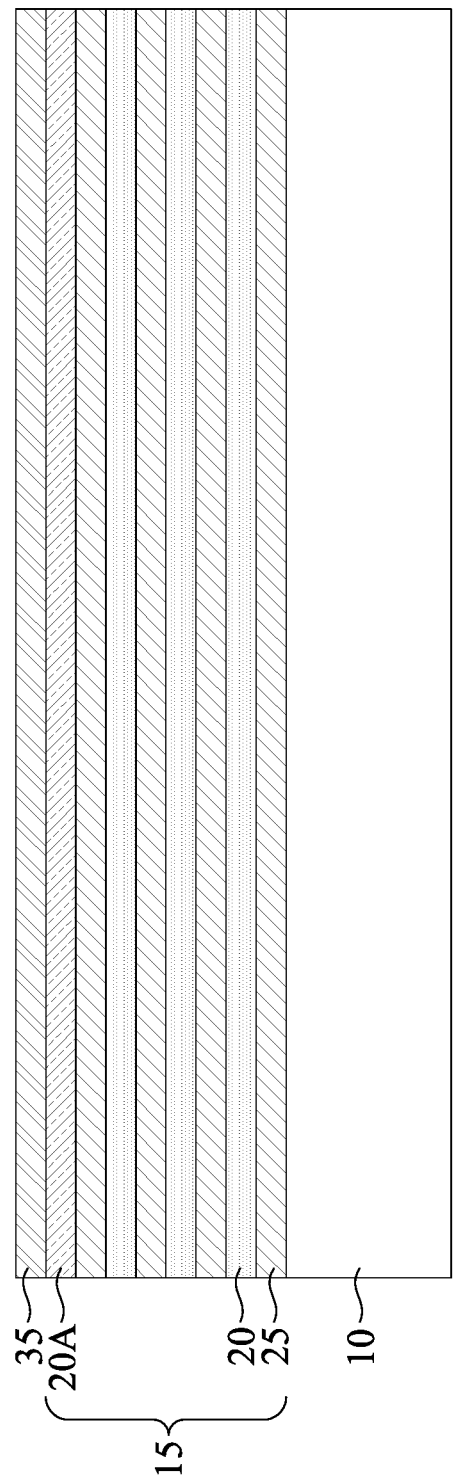
Figure 13A:
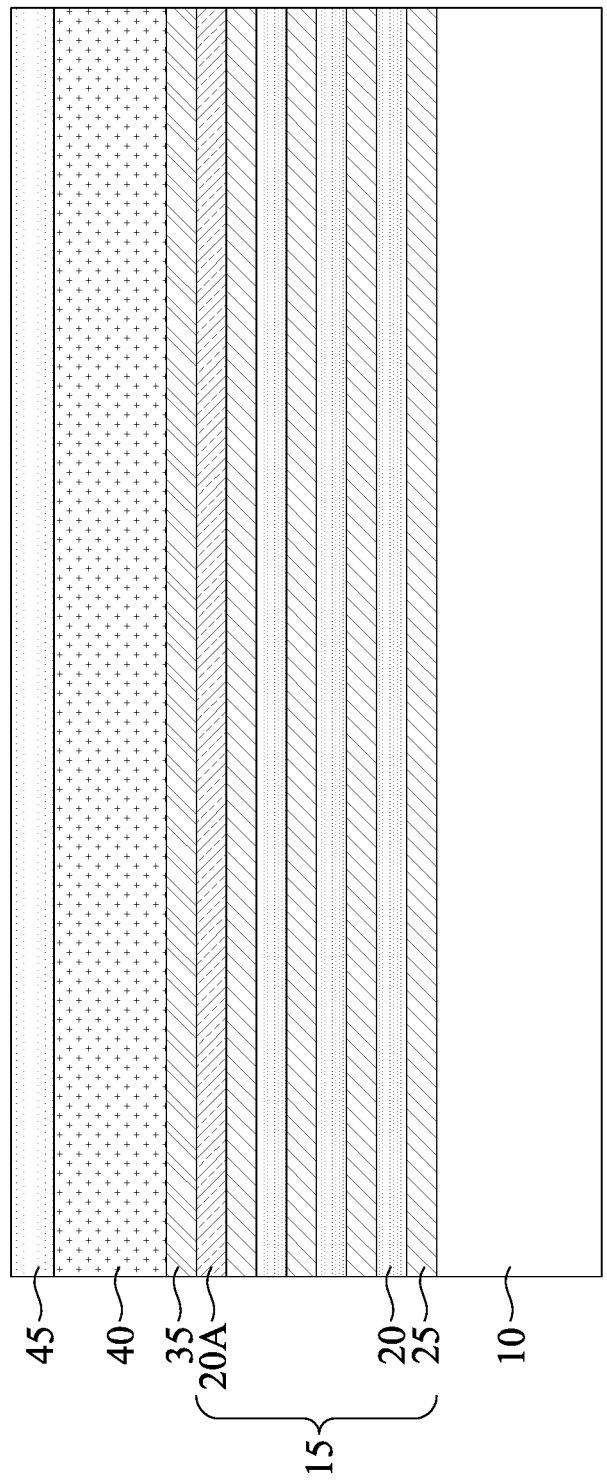

Reference is made to FIG. 12. A capping layer 35 is formed on the nitride layer 20A, as discussed previously with respect to FIG. 5. Then, an absorber layer 40 and an anti-reflection layer 45 are formed over the capping layer 35 in sequence, as discussed previously with respect to FIG. 6A, as shown in FIG. 13A. Thus, an EUV photo mask blank M3 is formed.

Figure 13B:
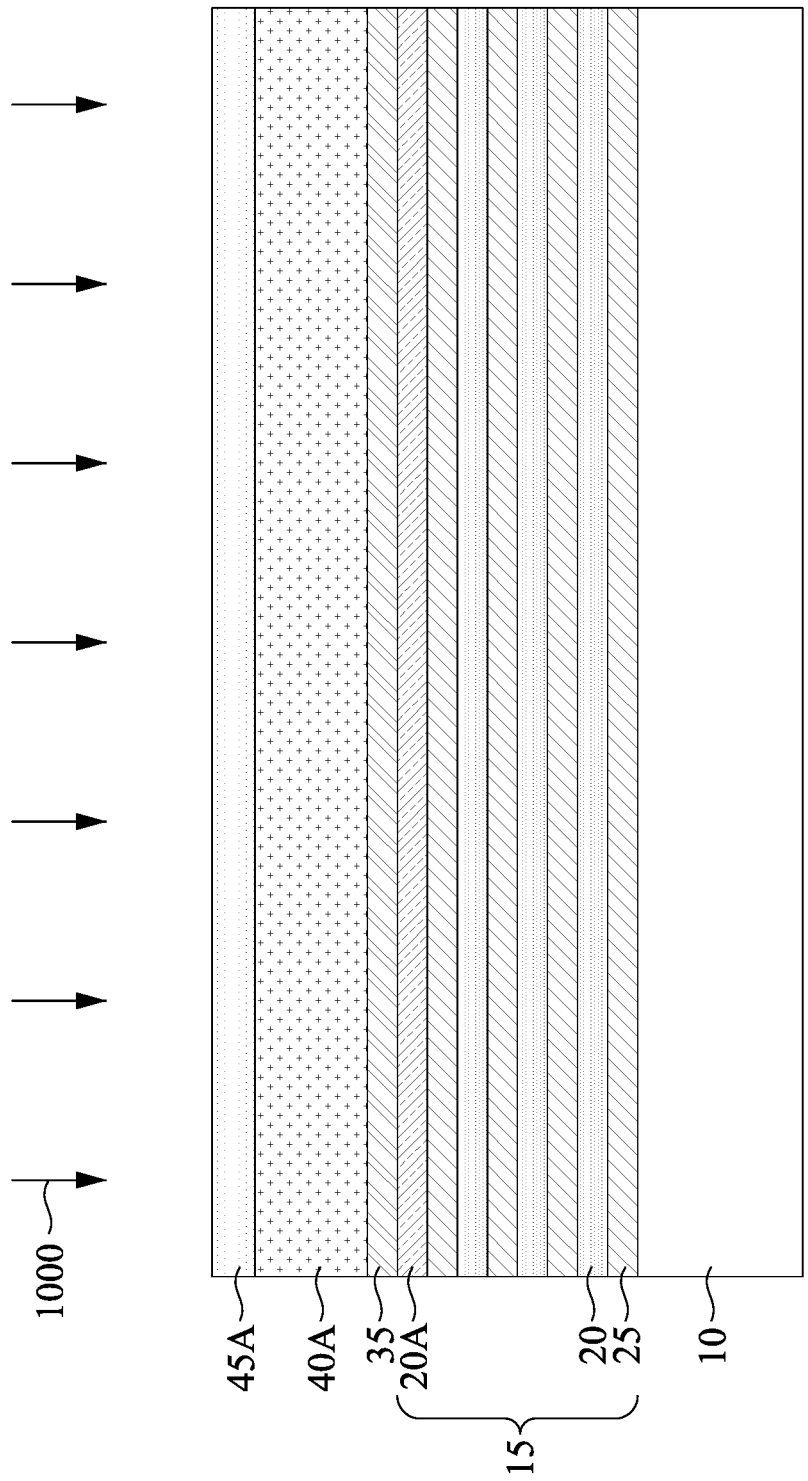

Reference is made to FIG. 13B. In some embodiments where the absorber layer 40 includes TaBN and the anti-reflection layer 45 includes TaBO, a doping process 1000 may be performed to the anti-reflection layer 45 and the absorber layer 40 to dope the absorber layer 40 and the anti-reflection layer 45 with dopants to form a doped absorber layer 40A and a doped anti-reflection layer 45A, as discussed previously with respect to FIG. 6B.

Figure 14A:
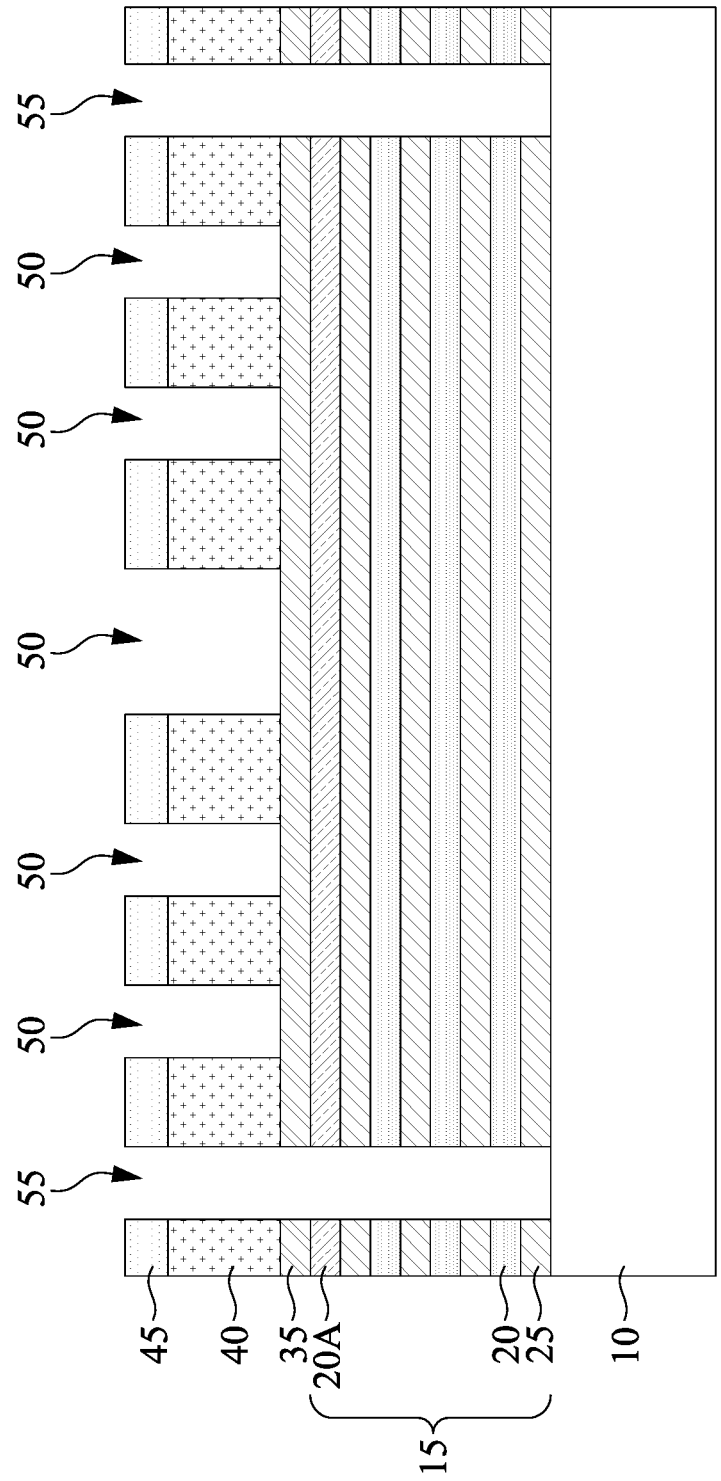

Reference is made to FIG. 14A. One or more circuit patterns 50 are formed on the EUV photo mask blank M3 (see FIG. 13A) by performing an etching step to pattern the absorber layer 40 and the anti-reflection layer 45. Thus, an EUV mask M4 is formed, as discussed previously with respect to FIG. 7A.

Figure 14B:
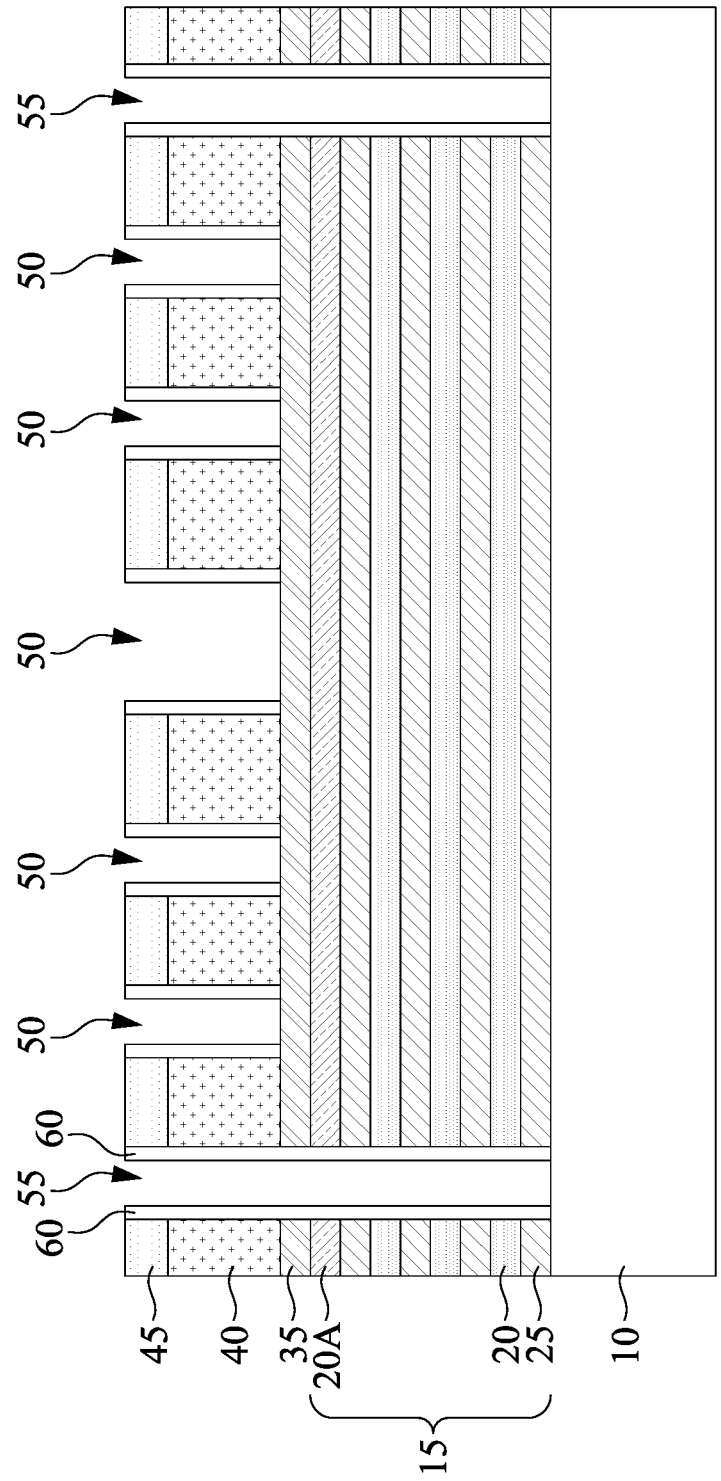

Reference is made to FIG. 14B. In some embodiments, a barrier layer 60 is formed along sidewalls of the circuit patterns 50 and the black border area 55, as discussed previously with respect to FIG. 7B. In some embodiments, the barrier layer 60 is a TaSiN layer.

Figure 15A:
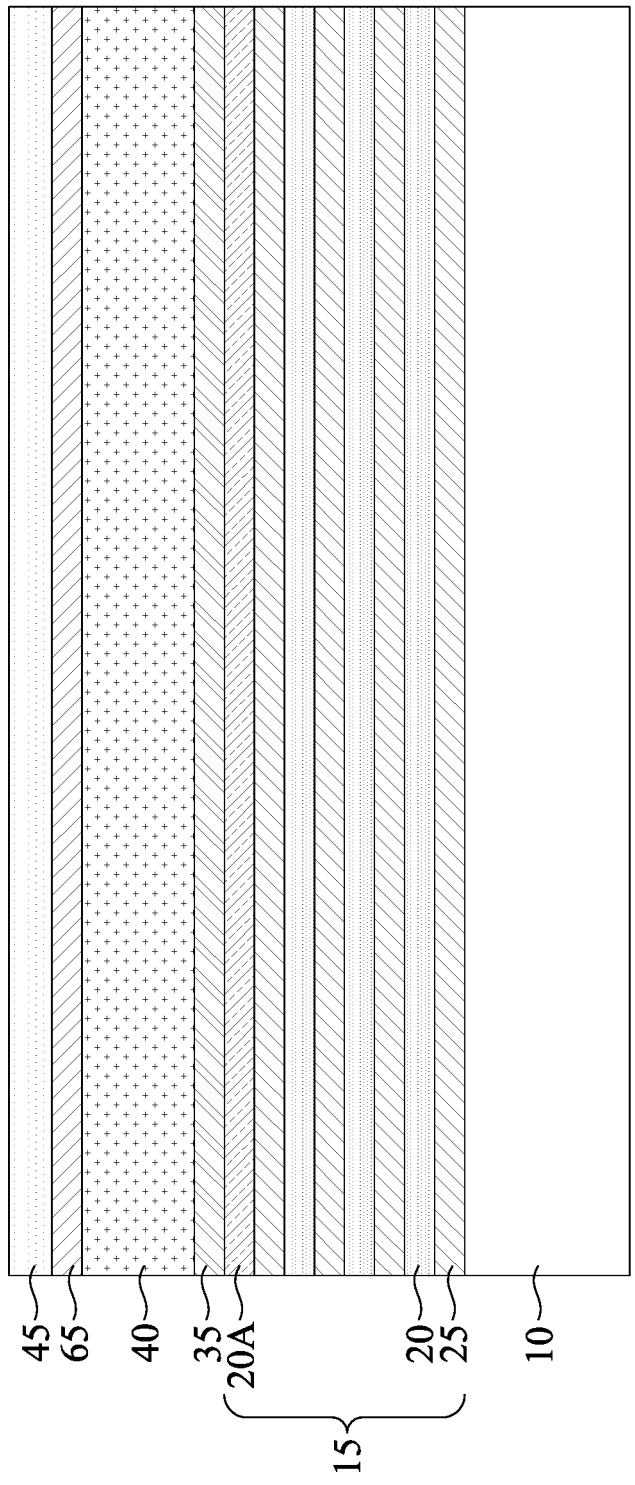
FIGS. 15A, 15B, 16A and 16B are cross-sectional views of various stages of a process for forming an extreme ultraviolet (EUV) mask in accordance with some embodiments.

FIGS. 15A, 15B, 16A and 16B are cross-sectional views of various stages of a process for forming an extreme ultraviolet (EUV) mask in accordance with another embodiment. Reference is made to FIG. 15A. FIG. 15A shows another EUV photo mask blank M3a similar to the EUV photo mask blank M3, except for an additional barrier layer 65 between the absorber layer 40 and the anti-reflection layer 45. In greater detail, the EUV photo mask blank M3a includes a substrate 10, a multilayer stack 15, a barrier layer 30, a capping layer 35, an absorber layer 40, a barrier layer 65 and an anti-reflection layer 45. As shown in FIG. 15A, the multilayer stack 15, the barrier layer 30, the capping layer 35 and the absorber layer 40 are formed over the substrate 10 in sequence using suitable methods, as discussed previously with respect to FIGS. 3-6A.

The barrier layer 65 is formed over the multilayer stack 15 to prevent hydrogen atoms or hydrogen radicals, which are generated by the EUV radiation, from penetrating into the absorber layer 40 and the capping layer 35. The third barrier layer 30 has a hydrogen diffusion coefficient less than a hydrogen diffusion coefficient of the silicon layer 20 and less than a hydrogen diffusion coefficient of silicon dioxide. In some embodiments, the barrier layer 65 is made of silicon nitride ($SiN_x$) such that the lattice constant of the barrier layer 65 is low enough to prevent hydrogen atoms and hydrogen molecules penetrating into the underlying layers. In some embodiments, the barrier layer 65 has a thickness in a range from about 2 nm to about 3 nm.

Figure 15B:
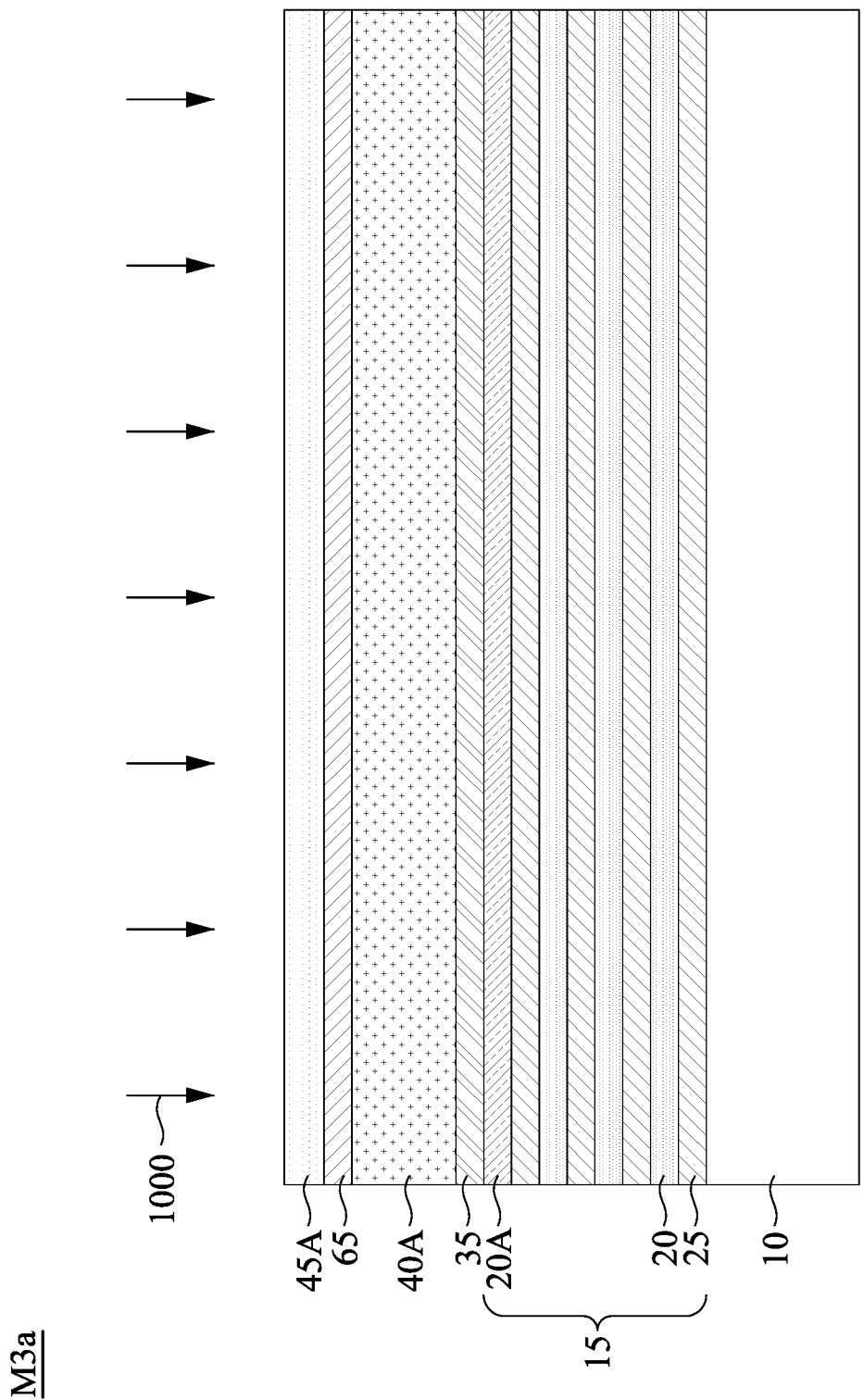

Reference is made to FIG. 15B. In some embodiments where the absorber layer 40 includes TaBN and the anti-reflection layer 45 includes TaBO, a doping process 1000 may be performed to the anti-reflection layer 45 and the absorber layer 40 to dope the absorber layer 40 and the anti-reflection layer 45 with dopants to form a doped absorber layer 40A and a doped anti-reflection layer 45A, as discussed previously with respect to FIG. 6B.

Figure 16A:
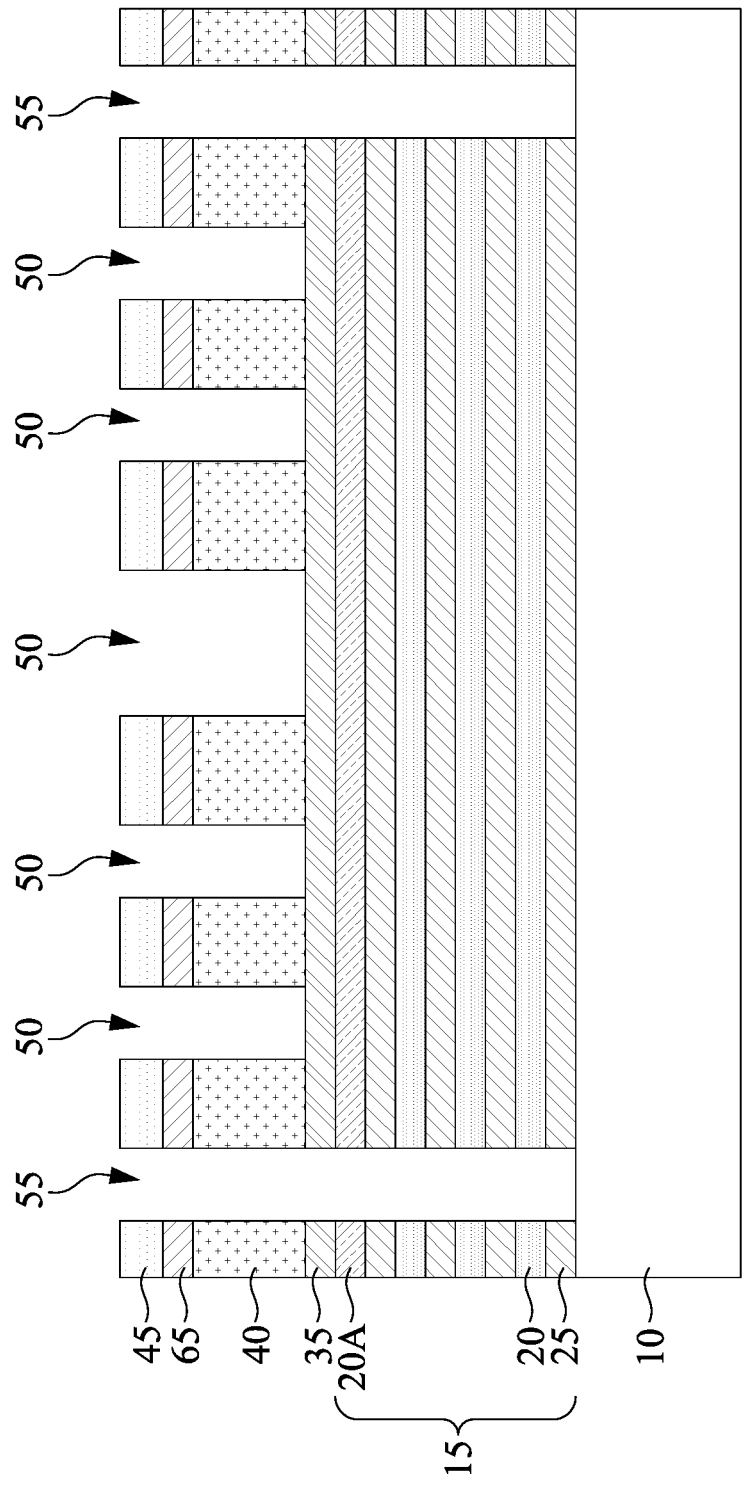

Reference is made to FIG. 16A. One or more circuit patterns 50 are formed on the EUV photo mask blank M3a by performing an etching step to pattern the absorber layer 40 and the anti-reflection layer 45. Thus, an EUV mask M4a is formed. During the etching step, the absorber layer 40 and the anti-reflection layer 45 are partially removed. Therefore, a top portion of the capping layer 35 is partially exposed. In addition, a black border area 55 surrounding a circuit pattern region and penetrating to the substrate is formed. The circuit patterns 50 are formed by using one or more lithography (e.g., electron beam lithography) and etching operations. In some examples, the area in which no circuit pattern is formed is covered by an absorber layer 40 so that the EUV light is not reflected.

Figure 16B:
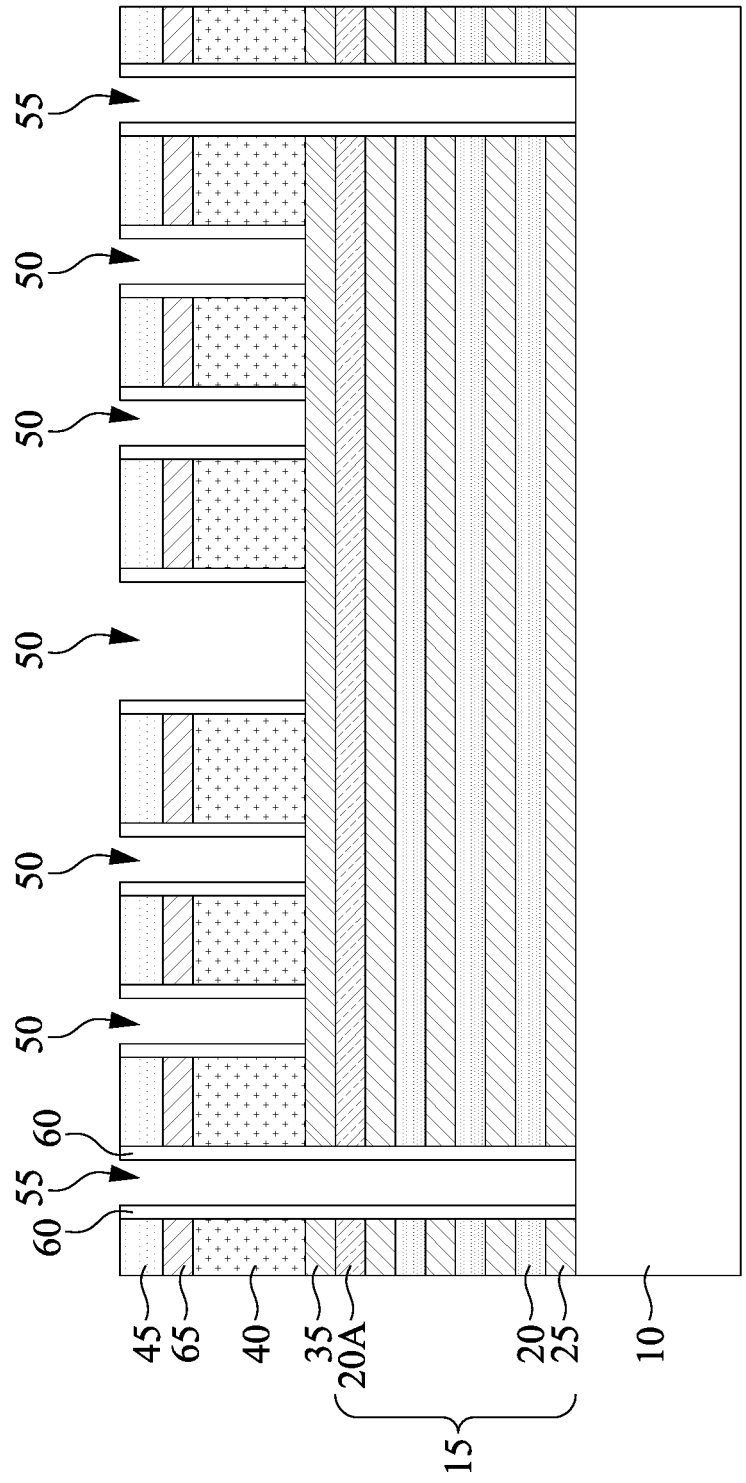

Reference is made to FIG. 16B. In some embodiments, a barrier layer 60 is formed along sidewalls of the circuit patterns 50 and the black border area 55, as discussed previously with respect to FIG. 7B. In some embodiments, the barrier layer 60 is a TaSiN layer.

Figure 17:
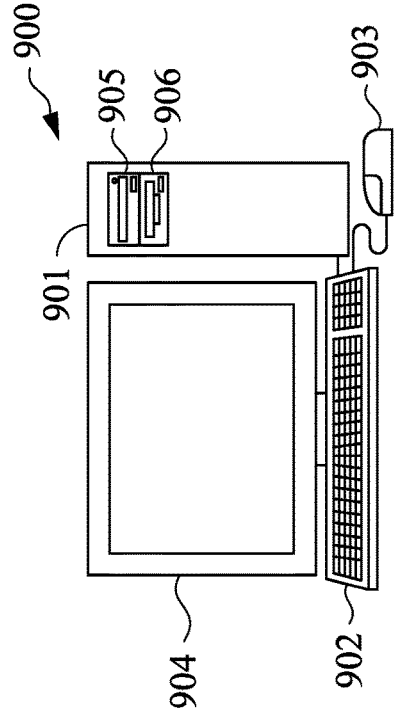
FIGS. 17 and 18 show a photo mask data generating apparatus according to an embodiment of the present disclosure.
Figure 18:
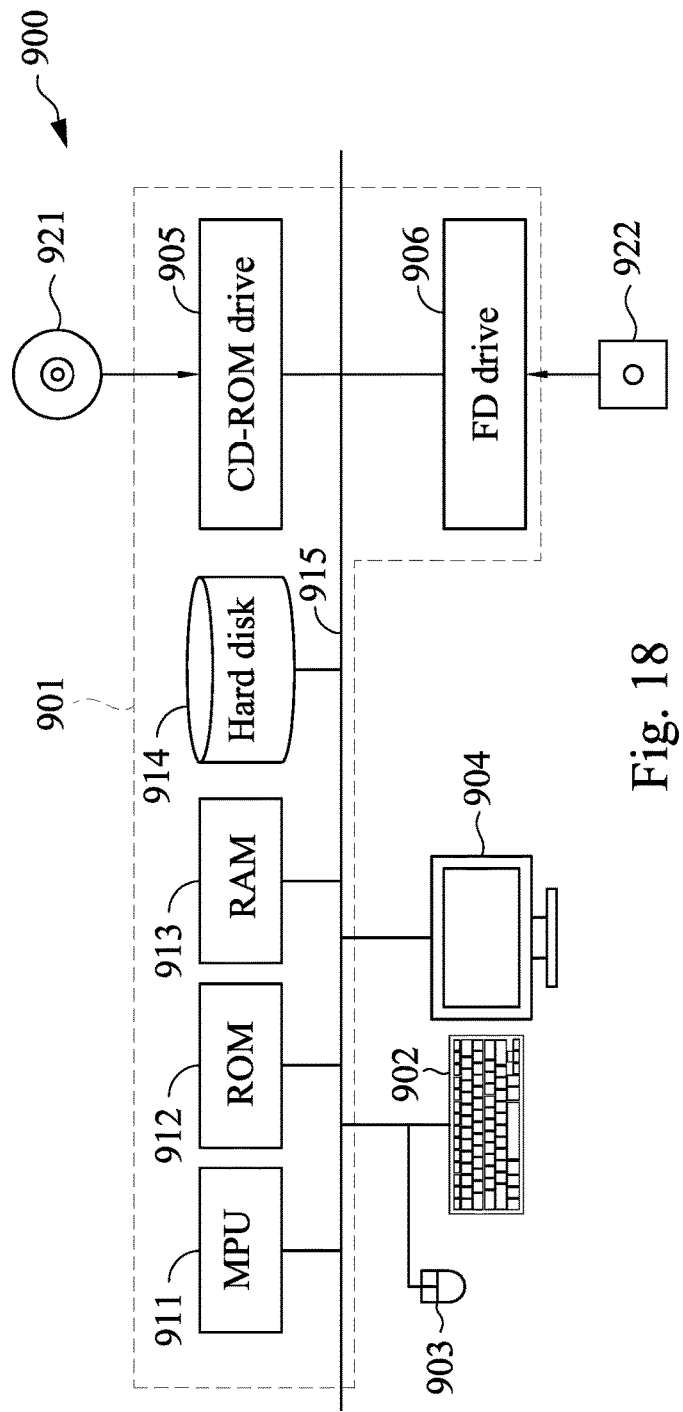

FIGS. 17 and 18 show a photo mask data generating apparatus according to an embodiment of the present disclosure. FIG. 17 is a schematic view of a computer system that executes the photo mask data generating process according to one or more embodiments as described above. All of or a part of the process, method and/or operations of the foregoing embodiments can be realized using computer hardware and computer programs executed thereon. In FIG. 17, a computer system 900 is provided with a computer 901 including an optical disk read only memory (e.g., CD-ROM or DVD-ROM) drive 905 and a magnetic disk drive 906, a keyboard 902, a mouse 903, and a monitor 904.

FIG. 18 is a diagram showing an internal configuration of the computer system 900. In FIG. 18, the computer 901 is provided with, in addition to the optical disk drive 905 and the magnetic disk drive 906, one or more processors 911, such as a micro processing unit (MPU), a ROM 912 in which a program such as a boot up program is stored, a random access memory (RAM) 913 that is connected to the MPU 911 and in which a command of an application program is temporarily stored and a temporary storage area is provided, a hard disk 914 in which an application program, a system program, and data are stored, and a bus 915 that connects the MPU 911, the ROM 912, and the like. Note that the computer 901 may include a network card (not shown) for providing a connection to a LAN.

The program for causing the computer system 900 to execute the functions of the photo mask data generating apparatus in the foregoing embodiments may be stored in an optical disk 921 or a magnetic disk 922, which are inserted into the optical disk drive 905 or the magnetic disk drive 906, and transmitted to the hard disk 914. Alternatively, the program may be transmitted via a network (not shown) to the computer 901 and stored in the hard disk 914. At the time of execution, the program is loaded into the RAM 913. The program may be loaded from the optical disk 921 or the magnetic disk 922, or directly from a network.

The program does not necessarily have to include, for example, an operating system (OS) or a third party program to cause the computer 901 to execute the functions of the photo mask data generating apparatus in the foregoing embodiments. The program may only include a command portion to call an appropriate function (module) in a controlled mode and obtain desired results.

In the programs, the functions realized by the programs do not include functions that can be realized only by hardware in some embodiments. For example, functions that can be realized only by hardware, such as a network interface, in an acquiring unit that acquires information or an output unit that outputs information are not included in the functions realized by the above-described programs in some embodiments. Furthermore, a computer that executes the programs may be a single computer or may be multiple computers.

Further, the entirety of or a part of the programs to realize the functions of the photo mask data generating apparatus is a part of another program used for photo mask fabrication processes in some embodiments. In addition, the entirety of or a part of the programs to realize the functions of the photo mask data generating apparatus is realized by a ROM made of, for example, a semiconductor device in some embodiments.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that hydrogen atoms and hydrogen molecules penetrating into the multilayer stack is prevented by providing the barrier layer made of silicon nitride ($SiN_x$) between the multilayer stack and the absorber layer since the hydrogen diffusion coefficient thereof is lower than the hydrogen diffusion coefficient of the topmost layer of the multilayer stack. Another advantage is that unwanted carbon contamination on the capping layer caused by photon and/or electron dissociation of residual carbon containing molecules in EUV exposure tools is prevented by providing the capping layer including the material of Ru-containing alloys since it has low dissolution and low reactivity with carbon. Yet another advantage is that the hydrogen atoms or hydrogen radicals, which are generated by the EUV radiation, are prevented from penetrating into the absorber layer and the capping layer by providing the barrier layer made of silicon nitride ($SiN_x$) over the absorber layer.

In some embodiments, a method of forming an extreme ultraviolet (EUV) mask includes forming a multilayer stack comprising alternating stacked Mo-containing layer and Si-containing layer over a mask substrate, forming a first nitride layer over the multilayer stack, forming a capping layer over the multilayer stack, forming an absorber layer over the capping layer, and etching the absorber layer to form a pattern in the absorber layer.

In some embodiments, an extreme ultraviolet lithography (EUVL) method includes turning on a droplet generator to eject a metal droplet toward a zone of excitation in front of a collector, turning on a laser source to emit a laser toward the zone of excitation, such that the metal droplet is heated by the laser to generate EUV radiation, guiding the EUV radiation, by using one or more first optics, toward a reflective mask in an exposure device, the reflective mask comprising a first nitride layer between an absorber layer and a multilayer stack, and guiding the EUV radiation, by using one or more second optics, reflected from the reflective mask toward a photoresist coated substrate in the exposure device.

In some embodiments, an extreme ultraviolet (EUV) mask includes a multilayer stack, a barrier layer, a capping layer and a patterned absorber layer. The multilayer stack comprises alternating stacked Mo-containing layers and Si-containing layers disposed over a mask substrate. The barrier layer is over the multilayer stack. The barrier layer has a lattice constant less than a lattice constant of the Si-containing layer. The capping layer is on the multilayer stack. The patterned absorber layer is on the capping layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an extreme ultraviolet (EUV) mask, comprising:
   forming a multilayer stack comprising alternating stacked Mo-containing layer and Si-containing layer over a mask substrate;
   forming a first nitride layer over the multilayer stack;
   forming a capping layer over the multilayer stack;
   forming an absorber layer over the capping layer; and
   etching the absorber layer to form a pattern in the absorber layer.

2. The method of claim 1, wherein forming the first nitride layer comprises performing a nitridation process such that a topmost layer of the multilayer stack is nitrided.

3. The method of claim 1, further comprising:
   forming a second nitride layer over the absorber layer, wherein the second nitride layer and the first nitride layer are formed of the same material.

4. The method of claim 1, wherein forming the capping layer is performed in-situ with forming the multilayer stack.

5. The method of claim 1, further comprising:
doping the absorber layer with silicon before etching the absorber layer.

6. The method of claim 1, further comprising:
forming an anti-reflection layer over the absorber layer; and
doping the absorber layer and the anti-reflection layer with silicon.

7. The method of claim 1, further comprising:
forming a third nitride layer along sidewalls of the pattern of the absorber layer after etching the absorber layer.

8. An extreme ultraviolet (EUV) mask, comprising:
a multilayer stack comprising alternating stacked Mo-containing layers and Si-containing layers disposed over a mask substrate;
a barrier layer over the multilayer stack, wherein the barrier layer has a lattice constant less than a lattice constant of the Si-containing layer;
a capping layer on the multilayer stack; and
a patterned absorber layer on the capping layer.

9. The EUV mask of claim 8, wherein the lattice constant of the barrier layer is less than a lattice constant of the capping layer.

10. The EUV mask of claim 8, wherein the barrier layer and the Si-containing layers have the same semiconductor material.

11. The EUV mask of claim 8, wherein the barrier layer is in contact with a topmost one of the Mo-containing layers of the multilayer stack.

12. The EUV mask of claim 8, wherein the barrier layer is in contact with a topmost one of the Si-containing layers of the multilayer stack.

13. The EUV mask of claim 8, wherein the Mo-containing layers comprise MoC.

14. The EUV mask of claim 8, wherein the Si-containing layers comprise RbSi.

15. A method of forming an extreme ultraviolet (EUV) mask, comprising:
forming a multilayer stack comprising alternating stacked Mo-containing layers and Si-containing layers over a mask substrate;
doping a first dopant to a topmost one of the Si-containing layers;
forming a Ru-containing layer over the multilayer stack;
forming an absorber layer over the Ru-containing layer;
doping a second dopant to the absorber layer; and
etching the absorber layer to form a pattern in the absorber layer.

16. The method of claim 15, wherein the Ru-containing layer is an alloy made of Ru and a first metal different from Ru.

17. The method of claim 16, wherein the first metal is Rh, Pd, Ir, or Pt.

18. The method of claim 15, wherein the first dopant and second dopant have different compositions.

19. The method of claim 15, wherein the first dopant is nitrogen atoms.

20. The method of claim 15, wherein the second dopant is semiconductor atom.

* * * * *